US010425059B2

(12) United States Patent
Obara et al.

(10) Patent No.: US 10,425,059 B2
(45) Date of Patent: Sep. 24, 2019

(54) CRYSTAL RESONATOR

(71) Applicant: NIHON DEMPA KOGYO CO., LTD., Tokyo (JP)

(72) Inventors: Shigeru Obara, Saitama (JP); Tetsuya Sato, Saitama (JP); Masaaki Nakahara, Saitama (JP); Tomonori Shibazaki, Saitama (JP); Yuki Oi, Saitama (JP); Yuya Nishimura, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 385 days.

(21) Appl. No.: 15/486,313

(22) Filed: Apr. 13, 2017

(65) Prior Publication Data

US 2017/0302249 A1 Oct. 19, 2017

(30) Foreign Application Priority Data

Apr. 13, 2016 (JP) .................. 2016-080528

(51) Int. Cl.
*H03H 9/17* (2006.01)
*H03H 3/04* (2006.01)
*H03H 9/02* (2006.01)

(52) U.S. Cl.
CPC .............. *H03H 9/17* (2013.01); *H03H 3/04* (2013.01); *H03H 9/02015* (2013.01); *H03H 2003/0407* (2013.01)

(58) Field of Classification Search
CPC .... H03H 9/17; H03H 9/2015; H03H 9/02102; H03H 3/04
See application file for complete search history.

(56) References Cited

U.S. PATENT DOCUMENTS

| 9,093,634 B2 * | 7/2015 | Il ........................... H03H 9/177 |
| 2004/0150901 A1 * | 8/2004 | Hiebert .................. G11C 11/16 360/1 |

(Continued)

FOREIGN PATENT DOCUMENTS

| CN | 103475328 | 12/2013 |
| JP | H05-243890 | 9/1993 |

OTHER PUBLICATIONS

"Office Action of Taiwan Counterpart Application," dated Feb. 27, 2019, with English translation thereof, p. 1-p. 7.

*Primary Examiner* — J. San Martin
(74) *Attorney, Agent, or Firm* — JCIPRNET

(57) ABSTRACT

A crystal resonator includes a crystal element and excitation electrodes. The crystal element has a pair of principal surfaces parallel to an X'-axis and a Z'-axis. The X'-axis is an axis of rotating an X-axis as a crystallographic axis of a crystal in a range of 15 degrees to 25 degrees around a Z-axis as a crystallographic axis of the crystal. The Z'-axis is an axis of rotating the Z-axis in a range of 33 degrees to 35 degrees around the X'-axis. The excitation electrodes are formed on the respective principal surfaces of the crystal element. Elliptical mesa portions or elliptical inverted mesa portions are formed on the respective principal surfaces. The mesa portions project from outer peripheries of the principal surfaces. The inverted mesa portions are depressed from the outer peripheries of the principal surfaces.

23 Claims, 20 Drawing Sheets

(56) References Cited

U.S. PATENT DOCUMENTS

| | | | |
|---|---|---|---|
| 2004/0173141 A1* | 9/2004 | Obara | C30B 33/00 |
| | | | 117/200 |
| 2009/0102326 A1* | 4/2009 | Chiba | H03H 9/02023 |
| | | | 310/367 |
| 2011/0058587 A1* | 3/2011 | Sakurai | B82Y 20/00 |
| | | | 372/46.01 |
| 2012/0200199 A1* | 8/2012 | Taniguchi | H03H 3/04 |
| | | | 310/348 |
| 2012/0212107 A1* | 8/2012 | Yamaguchi | H03H 9/02023 |
| | | | 310/353 |
| 2012/0306321 A1* | 12/2012 | Ishii | H03H 9/0542 |
| | | | 310/348 |
| 2013/0063002 A1* | 3/2013 | Mizusawa | H03H 9/0595 |
| | | | 310/365 |
| 2013/0328452 A1* | 12/2013 | Fujihara | H01L 41/0475 |
| | | | 310/365 |
| 2014/0203689 A1* | 7/2014 | Obata | H03H 9/19 |
| | | | 310/348 |
| 2014/0210570 A1* | 7/2014 | Nishihara | H03H 9/70 |
| | | | 333/133 |
| 2016/0268494 A1 | 9/2016 | Fujihara et al. | |
| 2018/0167051 A1* | 6/2018 | Kaga | H03H 3/04 |
| 2019/0067549 A1 | 2/2019 | Fujihara et al. | |

\* cited by examiner

CRYSTAL RESONATOR

CROSS-REFERENCE TO RELATED APPLICATIONS

This application is based on and claims priority under 35 U.S.C. § 119 to Japanese Patent Application No. 2016-080528, filed on Apr. 13, 2016, the entire content of which is incorporated herein by reference.

TECHNICAL FIELD

This disclosure relates to a crystal resonator where a doubly-rotated cut crystal element is used.

DESCRIPTION OF THE RELATED ART

There has been known a doubly-rotated crystal resonator that uses a doubly-rotated cut crystal element. The doubly-rotated cut crystal element is formed by cutting a crystal parallel to an X'-axis, an axis of rotating an X-axis as a crystallographic axis of the crystal by $\phi$ degrees around a Z-axis as a crystallographic axis and a Z'-axis, an axis of rotating the Z-axis around the X'-axis by $\theta$ degrees. Japanese Unexamined Patent Application Publication No. 5-243890 describes an SC-cut crystal resonator with, for example, $\phi$ of approximately 22 degrees and $\theta$ of approximately 34 degrees. Such doubly-rotated crystal resonator features good thermal shock property compared with that of an AT-cut crystal resonator and exhibits a zero temperature coefficient at a comparatively high temperature around 80° C. Accordingly, the doubly-rotated crystal resonator is housed in an oven heated to a constant temperature at, for example, around 80° C. and is used as a highly-stable crystal controlled oscillator.

However, the doubly-rotated crystal resonator as disclosed in JP-A-5-243890 has the following problems. Unwanted responses in a contour mode and a flexure mode combine with the main vibration. This is likely to cause a sudden frequency change and a change in crystal impedance (CI) due to a temperature change. Since the doubly-rotated crystal resonator and the AT-cut crystal resonator have modes of vibration different from one another, it is difficult to reduce the unwanted response with the use of the technique of the AT-cut crystal resonator for the doubly-rotated crystal resonator as it is.

A need thus exists for a crystal resonator which is not susceptible to the drawback mentioned above.

SUMMARY

According to a first aspect of this disclosure, there is provided a crystal resonator that includes a crystal element and excitation electrodes. The crystal element has a pair of principal surfaces parallel to an X'-axis and a Z'-axis. The X'-axis is an axis of rotating an X-axis as a crystallographic axis of a crystal in a range of 15 degrees to 25 degrees around a Z-axis as a crystallographic axis of the crystal. The Z'-axis is an axis of rotating the Z-axis in a range of 33 degrees to 35 degrees around the X'-axis. The excitation electrodes are formed on the respective principal surfaces of the crystal element. Elliptical mesa portions or elliptical inverted mesa portions are formed on the respective principal surfaces. The mesa portions project from outer peripheries of the principal surfaces. The inverted mesa portions are depressed from the outer peripheries of the principal surfaces.

BRIEF DESCRIPTION OF THE DRAWINGS

The foregoing and additional features and characteristics of this disclosure will become more apparent from the following detailed description considered with reference to the accompanying drawings, wherein:

FIG. 11C is a plan view of a crystal resonator 700a;

DETAILED DESCRIPTION

The embodiments of this disclosure will be described in detail with reference to the drawings. The embodiments in the following description do not limit the scope of the disclosure unless otherwise stated.

[Configuration of Crystal Resonator 100 according to First Embodiment]

Figure 1:
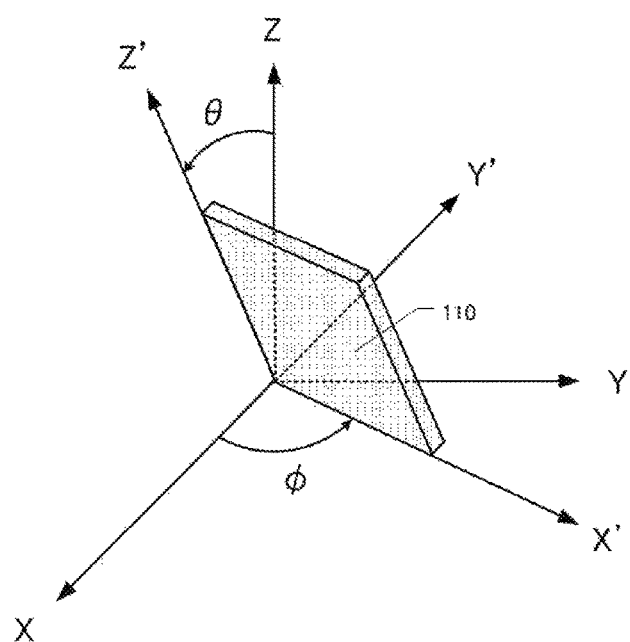
FIG. 1 is an explanatory drawing of a doubly-rotated cut crystal element 110.

FIG. 1 is an explanatory drawing of a doubly-rotated cut crystal element 110. FIG. 1 denotes crystallographic axes for a crystal as an X-axis, a Y-axis, and a Z-axis. The doubly-rotated cut crystal element 110 is formed by cutting the crystal parallel to an X'-axis, an axis of rotating the X-axis as the crystallographic axis of the crystal around the Z-axis by φ degrees as the crystallographic axis of the crystal and a Z'-axis, an axis of rotating the Z-axis around the X'-axis by θ degrees. Therefore, the doubly-rotated cut crystal element 110 is formed such that the X'-Z' surface becomes a principal surface. FIG. 1 shows a Y'-axis perpendicular to the X'-axis and the Z'-axis.

As the doubly-rotated cut crystal element illustrated in FIG. 1, for example, there has been known an SC-cut crystal element with φ of approximately 22 degrees and θ of approximately 34 degrees, an IT-cut crystal element with φ of approximately 19 degrees and θ of approximately 34 degrees, and an FC-cut crystal element with φ of approximately 15 degrees and 0 of 34.33 degrees. These crystal elements have φ between 15 degrees and 25 degrees and θ between 33 degrees and 35 degrees. The following gives the description assuming the use of the doubly-rotated cut crystal element with φ between 15 degrees and 25 degrees and θ between 33 degrees and 35 degrees.

Figure 2A:
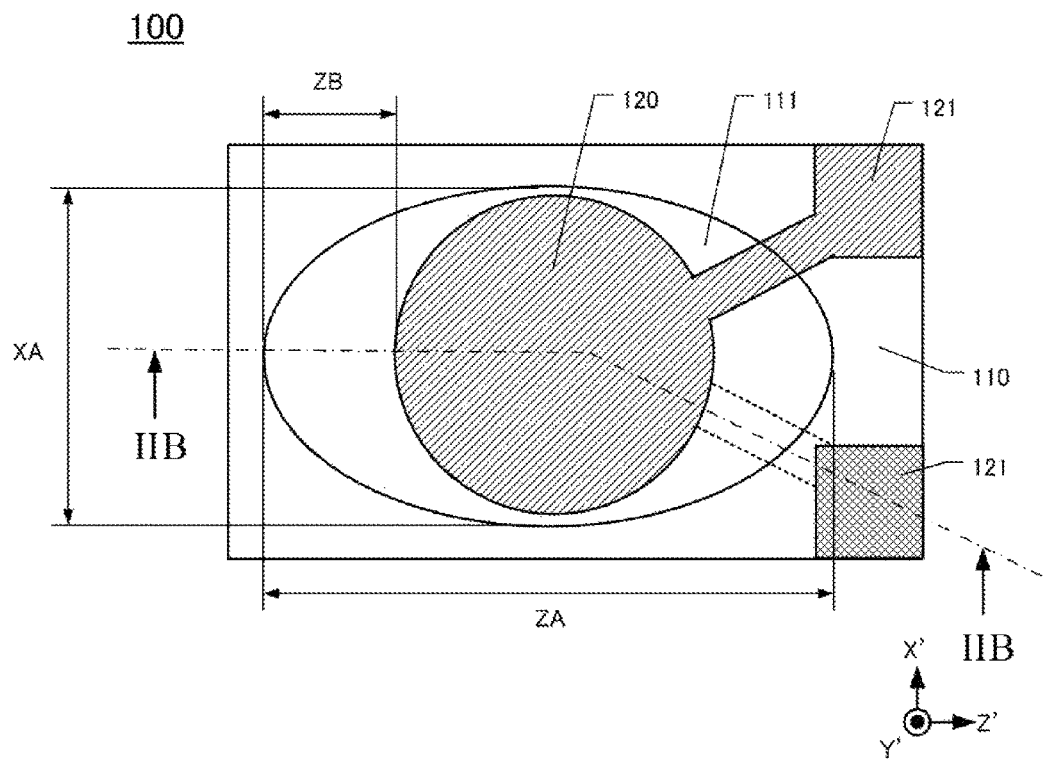
FIG. 2A is a plan view of a crystal resonator 100.

FIG. 2A is a plan view of the crystal resonator 100. The crystal resonator 100 includes a crystal element 110, excitation electrodes 120, and extraction electrodes 121. The crystal element 110 is formed into a rectangular shape whose long sides extend in the Z'-axis direction and short sides extend in the X'-axis direction. Elliptical mesa portions 111 projecting from respective principal surfaces are formed on the principal surfaces on the +Y'-axis side and the −Y'-axis side. The crystal element 110 has the rectangular shape and arranging an outer shape of the square-plate-shaped crystal element is easy and the production cost can be reduced low; therefore, the crystal resonator is preferable.

The circular excitation electrodes 120 are formed on the respective front and back principal surfaces (the respective surfaces on the +Y'-axis side and the −Y'-axis side) of the crystal element 110. The respective excitation electrodes 120 on both principal surfaces have the identical shape and are formed such that centers of the respective excitation electrodes 120 and centers of the mesa portions 111 match with one another in the Y'-axis direction. The extraction electrodes 121 are each extracted from the excitation electrodes 120 to a side on the +Z'-axis side of the crystal element 110.

Conventionally, while the crystal element has been formed into the square plate shape in accordance with downsizing of the crystal resonator, to provide the excitation electrode with a large area in order to achieve a good electric constant, the excitation electrode has been formed into the square shape. However, the square excitation electrode is likely to cause a coupling of an unwanted response in a flexure mode with a reflected wave from an end surface of the crystal element. This has caused a variation of and an increase in CI value. In contrast to this, a circular excitation electrode can reduce the reflected wave from the end surface of the crystal element and can prevent the coupling, thereby ensuring preventing the variation of and the increase in CI value.

The mesa portion 111 in the crystal element 110 is formed such that the long axis extends in the Z'-axis direction and the short axis extends in the X'-axis direction. FIG. 2A denotes a length of the long axis of the mesa portion 111 as ZA, a length of the short axis of the mesa portion 111 as XA, and a difference between a long radius of the mesa portion 111 and a radius of the excitation electrode 120 as ZD. In the case where the length ZA of the long axis of the mesa portion 111 is in a range of 1.05 times to 2.0 times of the length XA of the short axis, the variation of and the increase in CI value tend to be reduced and therefore such length is preferable due to the following reasons. In the case where the length ZA of the long axis is smaller than 1.05 times of the length XA of the short axis, since the excitation electrode has the shape close to the circular shape, the area of the excitation electrode cannot be widened. In the case where the length ZA of the long axis is larger than 2.0 times of the length XA of the short axis, the effects of ensuring preventing the variation of and the increase in CI value, which are seen in the circular excitation electrode, probably weaken.

Figure 2B:
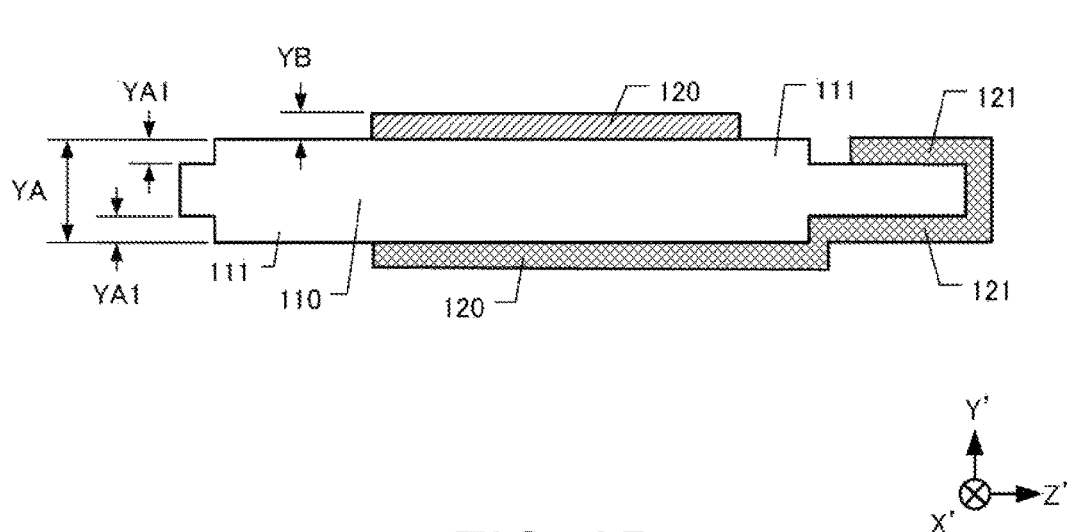
FIG. 2B is a cross-sectional view taken along a line IIB-IIB in FIG. 2A.

FIG. 2B is a cross-sectional view taken along a line IIB-IIB in FIG. 2A. FIG. 2B denotes a whole thickness of the crystal element 110 as YA, a thickness of the mesa portion 111 as YA1, and a thickness of the excitation electrode 120 as YB. The excitation electrode 120 and the extraction electrode 121 are formed by forming, for example, a chrome (Cr) or a nickel (Ni) as a foundation layer and manufacturing a film of a gold (Au) on the foundation layer. In association with downsizing of the crystal element in the crystal resonator, an influence given from a support of the crystal element to vibrations increases. With the crystal resonator 100, since the excitation electrodes 120 and the extraction electrodes 121 to which the crystal element is supported are formed on different stages in the crystal element, the influence of unnecessary vibrations given to the vibrations is reduced.

The thickness YB of the excitation electrode 120 is preferably formed to be the thickness between 700·Å and 2000·Å and is especially preferably formed between 1200·Å and 1600·Å because of the following reasons. The extremely thinned excitation electrode fails to function as the electrode and therefore cannot confine a main vibration. The extremely thickened excitation electrode increases a weight of the electrode, resulting in the increase in CI value and the variation of CI value. There is a preferable relationship between the thickness YA and the thickness YB. The thickness YB with the value between 0.03% and 0.18% of the thickness YA generates a small variation of CI value and therefore is preferable. Since an oscillation frequency of the crystal resonator is inversely proportional to the thickness of the crystal element, the thickness YA is determined according to the oscillation frequency of the crystal resonator 100.

Therefore, the thickness YB is determined to have the value between 0.03% and 0.18% of the thickness YA and between 700·Å and 2000·Å according to the thickness YA. Furthermore, in the case where the thickness YB of the excitation electrode 120 is formed in a range of ¼ times to one time with respect to a total value of the thickness YA1 of the mesa portion 111 and the thickness YB of the excitation electrode 120 and the thickness YA1 is determined so as to fall within a range of 0.07% to 1.9% of the thickness YA, the increase in CI value and the variation of CI value can be reduced and therefore is preferable.

[Mesa Portion]

With the crystal resonator 100, the mesa portions 111 are formed on the crystal element 110 to reduce the CI value. The following describes effects brought by the mesa portion.

Figure 3A:
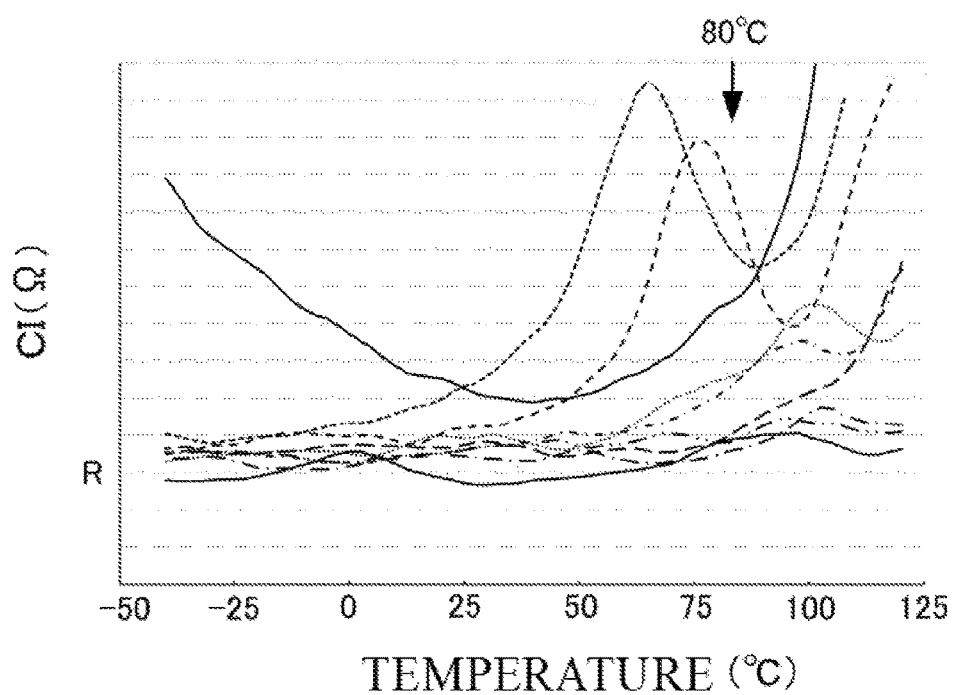
FIG. 3A is a graph showing a change in CI value according to a temperature in the case where crystal elements have a flat plate shape and excitation electrodes are single layers.

FIG. 3A is a graph showing a change in CI value according to a temperature in the case where crystal elements have a flat plate shape and excitation electrodes are single layers. The horizontal axis indicates the temperature of the crystal resonator, and the vertical axis indicates the CI value. FIG. 3A shows the change in CI value of the nine crystal resonators according to the temperature. FIG. 3A shows results in the case where the crystal resonators that include the excitation electrodes with a thickness of 1400·Å and a diameter of 0.6 A mm on the crystal elements with an A-mm square formed by an evaporation method were oscillated at 30 MHz.

It is found from FIG. 3A that a tendency of the change in CI value according to the temperature substantially differs depending on the crystal resonator; therefore, the CI value is unstable. For example, at 80° C., the temperature at which a doubly-rotated crystal resonator is possibly used, the lowest CI value is approximately (R+50)Ω and the highest CI value is approximately (R+850)Ω. That is, FIG. 3A shows that the crystal resonators possibly cause the variation of approximately 800Ω at 80° C.

Figure 3B:
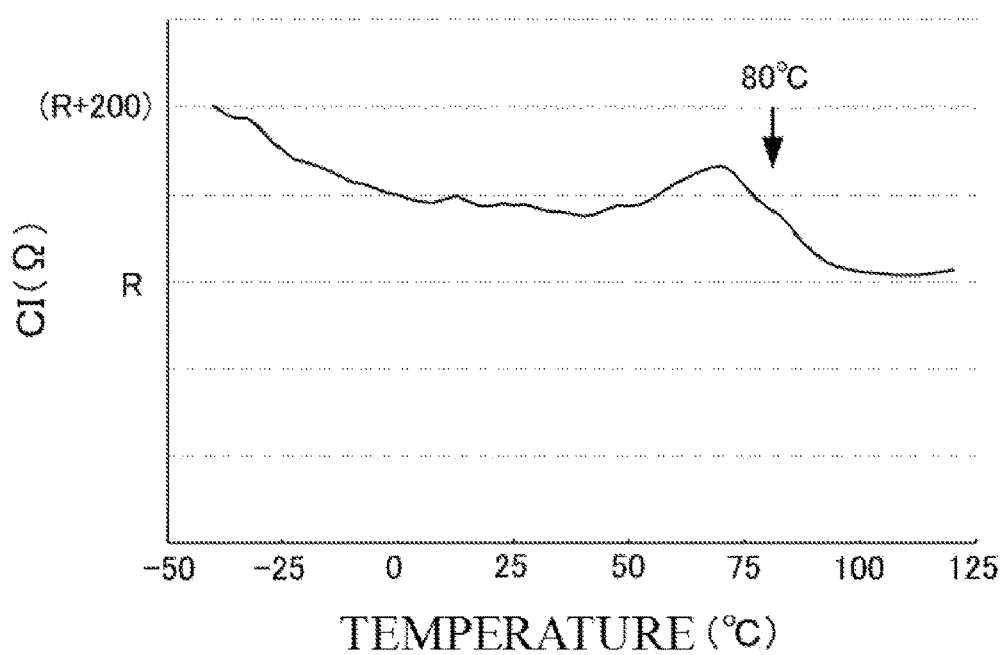
FIG. 3B is a graph showing the change in CI value according to the temperature in the case where a crystal resonator with circular mesa portions formed is oscillated at 30 MHz.

FIG. 3B is a graph showing the change in CI value according to the temperature in the case where a crystal resonator with circular mesa portions formed is oscillated at 30 MHz. The crystal resonator in FIG. 3B is a crystal resonator where the circular mesa portions are formed on respective square-shaped principal surfaces with B-mm square of the crystal element. The mesa portions each have a thickness 3% of the thickness of the crystal element. The CI values in FIG. 3B changes approximately between RΩ and (R+200)Ω. At 80° C., the temperature at which the doubly-rotated crystal resonator is possibly used, the CI value is approximately (R+85)Ω.

Figure 3C:
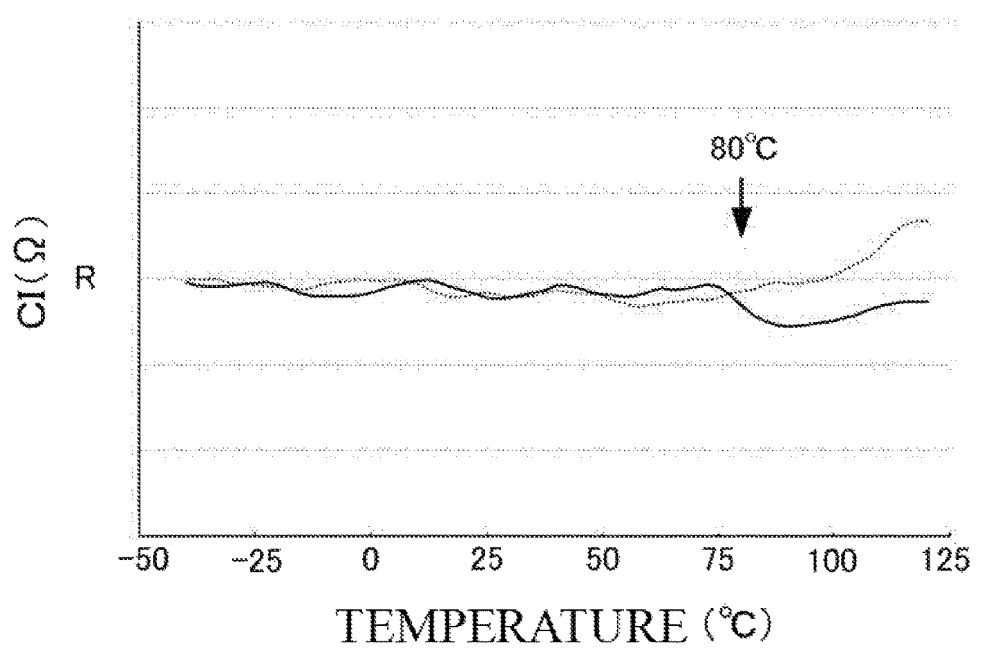
FIG. 3C is a graph showing the change in CI value according to the temperature in the case where crystal resonators with elliptical mesa portions Ruined are oscillated at 30 MHz.

FIG. 3C is a graph showing the change in CI value according to the temperature in the case where crystal resonators with elliptical mesa portions formed are oscillated at 30 MHz. FIG. 3C shows the change in CI value of the two crystal resonators according to the temperature. The crystal resonators in FIG. 3C are crystal resonators where the elliptical mesa portions are formed on respective square-shaped principal surfaces with B-mm square of the crystal element. The mesa portions each have the thickness 1.4% of the thickness of the crystal element, a length of a long axis extending in the X'-axis direction of 0.87 B mm, and a length of a short axis of 0.65 B mm. The CI values in FIG. 3C approximately have around RΩ in the entire temperature range. At 80° C., the temperature at which the doubly-rotated crystal resonator is possibly used, the one CI value is approximately (R−30)Ω and the other CI value is approximately (R−15)Ω.

It is found that, the crystal resonators with the elliptical mesa portions shown in FIG. 3C have the CI values lower than the crystal resonators without the mesa portions illustrated in FIG. 3A and the crystal resonator with the circular mesa portion shown in FIG. 3B in the entire temperature range and at 80° C. Therefore, the elliptical mesa portion is considered to be preferably formed on the crystal resonator.

[Direction that Long Axis of Mesa Portion Extends]

Figure 4A:
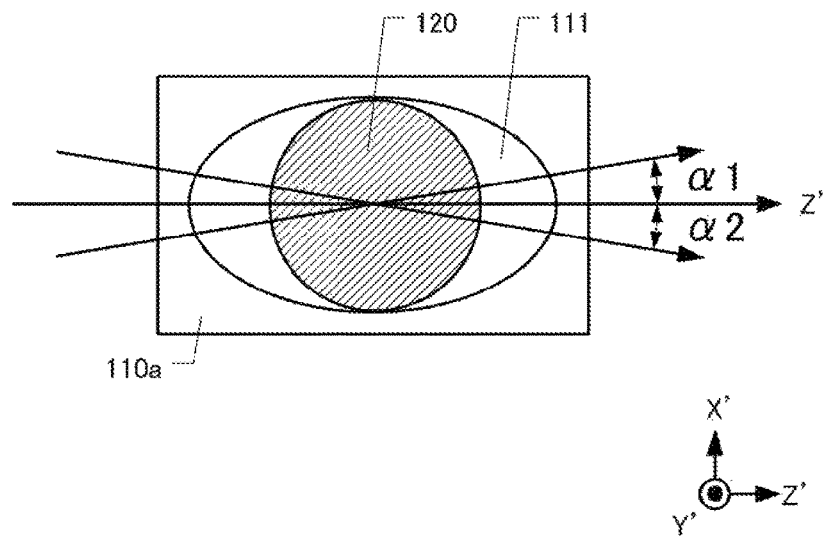
FIG. 4A is a schematic plan view of a crystal resonator 100a, and FIG. 4B is a schematic plan view of a crystal resonator 100b.

FIG. 4A is a schematic plan view of a crystal resonator 100a. The crystal resonator 100a includes a crystal element 110a where the mesa portion 111 is formed and the excitation electrode 120. Although an extraction electrode and a similar member are also formed on the crystal resonator 100a, FIG. 4A illustrates only the crystal element 110a and the excitation electrode 120.

With the crystal resonator, in the case where the long axis of the mesa portion with the elliptical outer shape extends in the Z'-axis direction, flexure vibrations, which are the unwanted responses, transmitted in the Z'-axis direction can be reduced. This can reduce the increase in CI value. Assuming that an angle formed by rotating the Z'-axis counterclockwise as α1 and an angle formed by rotating the Z'-axis clockwise as α2, when the direction that the long axis of the mesa portion 111 extends is a direction with α1 and α2 in a range of 5 degrees, an effect that the flexure vibration can be reduced is likely to be obtained. That is, assuming that the counterclockwise direction as a positive direction while the clockwise direction as a negative direction, the case where the long axis of the mesa portion 111 extends in the direction in the range of ±5 degrees with respect to the direction that the Z'-axis extends is preferable.

Figure 4B:
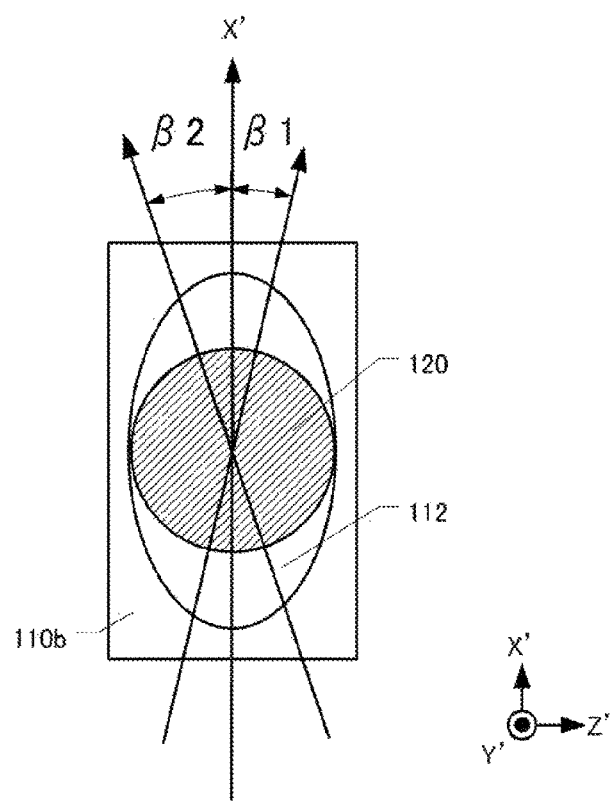

FIG. 4B is a schematic plan view of a crystal resonator 100b. The crystal resonator 100b includes a crystal element 110b where a mesa portion 112 is formed and the excitation electrode 120. Although an extraction electrode and a similar member are also formed on the crystal resonator 100b, FIG. 4B illustrates only the crystal element 110b and the excitation electrode 120. The mesa portion 112 is formed into the elliptical shape whose long axis extends in the X'-axis direction. The crystal element 110b is formed into a rectangular shape whose long sides extend in the X'-axis direction.

With the mesa portion whose long axis extending in the X'-axis direction, it is preferable to extend the long axis in a range from −5 degrees to +15 degrees with respect to the X'-axis (namely, the range indicated by β1 and β2 in FIG. 4B). According to experiments by the inventor, this configuration easily confines a C mode, which is the main vibration, and an end surface reflection, which is the unwanted response, can be reduced, thereby ensuring reducing the increase in CI value.

[Second Embodiment]

The crystal element can be formed into various shapes. The following describes modifications of the crystal element.

[Configurations of Crystal Resonator 200a and Crystal Resonator 200b]

Figure 5A:
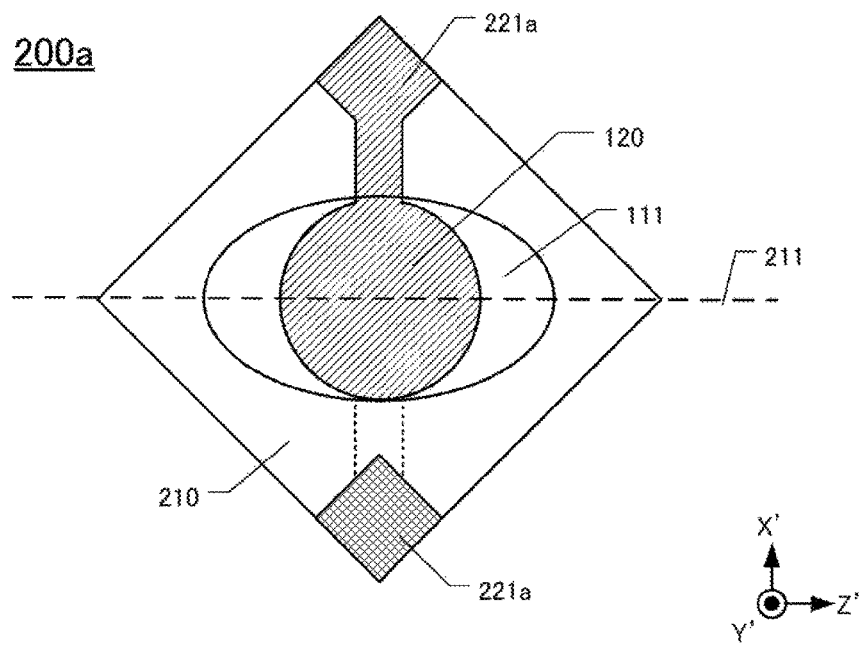
FIG. 5A is a plan view of a crystal resonator 200a, and FIG. 5B is a plan view of a crystal resonator 200b.

FIG. 5A is a plan view of the crystal resonator 200a. The crystal resonator 200a includes a crystal element 210, the excitation electrodes 120, and extraction electrodes 221a. The crystal element 210 has square principal surfaces, and the mesa portions 111 are formed on the crystal element 210. The excitation electrodes 120 are formed on the mesa portions 111 on both principal surfaces of the crystal element 210. The extraction electrodes 221a are extracted from the respective excitation electrodes 120. While the crystal element 110 (see FIG. 2A) is formed into the rectangular shape, arranging the shape of the square crystal element 210, which has the short side length identical to the long side length, is also easy and the production cost can be reduced low, and thereby the crystal element 210 is preferable.

The crystal element 210 has one diagonal line 211 parallel to the Z'-axis. A long axis of the mesa portion 111 is formed to go along the diagonal line 211. Forming the mesa portion 111 along the diagonal line 211 allows forming an area of the mesa portion 111 large in the crystal element 210 with predetermined size. Widening the area of the mesa portion 111 increases an equivalent series capacitance C1 and therefore strengthens plasticity. This reduces an equivalent series resistance R1 and reduces a loss of vibration energy and therefore is preferable. With the crystal resonator 200a, the respective extraction electrodes 221a are extracted to corners on a diagonal line of the crystal element 210 on the +X'-axis side and the −X'-axis side of the crystal element 210.

Figure 5B:
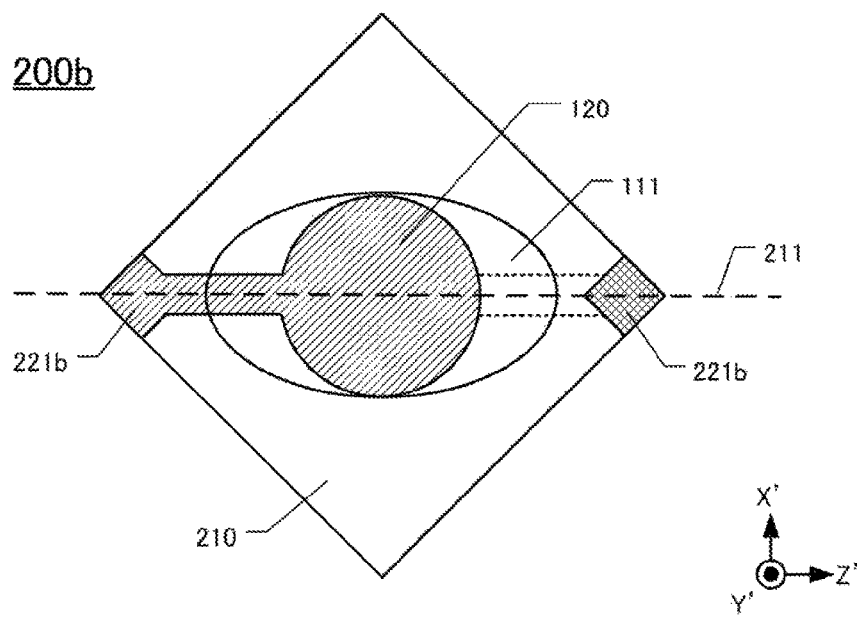

FIG. 5B is a plan view of the crystal resonator 200b. The crystal resonator 200b includes the crystal element 210, the excitation electrodes 120, and extraction electrodes 221b. The crystal element 210 has square principal surfaces, and the mesa portions 111 are formed on the crystal element 210. The excitation electrodes 120 are formed on the mesa portions 111 on both principal surfaces of the crystal element 210. The extraction electrodes 221b are extracted from the respective excitation electrodes 120. The extraction electrodes 221b are extracted to corners of the crystal element 210 on the +Z'-axis side and the −Z'-axis side of the excitation electrodes 120. In both cases of FIG. 5A and FIG. 5B, the crystal element is held at the corner portions on the diagonal line of the crystal element, ensuring stably holding the crystal element. However, the holding positions are not limited to these. FIG. 5A and FIG. 5B show the examples where the diagonal lines of the crystal elements are parallel to the Z'-axis and therefore the corner portions of the crystal elements are positioned on the Z'-axis and the X'-axis. Note that, considering an influence given to the support or a similar influence, the diagonal line of the crystal element meets a preferable positional relationship where the diagonal line is not parallel to the Z'-axis and is positioned in a range of ±10 degrees with respect to the Z'-axis, that is, the corner portions of the crystal element are positioned on a line displaced from the Z'-axis and the X'-axis by predetermined degrees in some cases.

[Configurations of Crystal Resonator 300a and Crystal Resonator 300b]

Figure 6A:
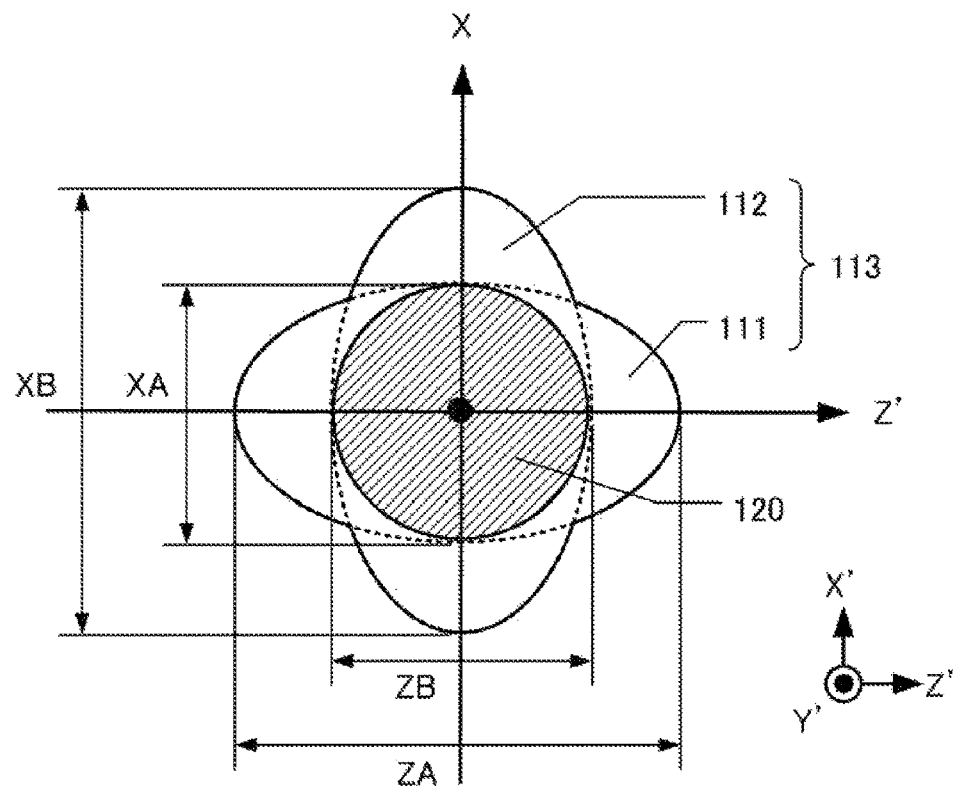
FIG. 6A is a plan view of a mesa portion 113.

FIG. 6A is a plan view of a mesa portion 113. The mesa portion 113 is formed into a shape of overlapping the mesa portion 111 illustrated in FIG. 4A with the mesa portion 112 illustrated in FIG. 4B with the centers of the mesa portion 111 and the mesa portion 112 matched with one another. XB denotes a length of a long axis of the mesa portion 112, and ZB denotes a length of a short axis of the mesa portion 112. Then, similar to the mesa portion 111 illustrated in FIG. 2A, the mesa portion 112 is formed such that the length XB of the long axis of the mesa portion 112 falls within a range of 1.1 times to 2.0 times of the length ZB of the short axis. The lengths of the short axes and the long axes of the mesa portion 111 and the mesa portion 112 may be identical to or different from one another.

With the mesa portion having the long axis parallel to the Z'-axis like the mesa portion 111, the flexure vibration, which is the unwanted response, transmitted in the Z'-axis direction can be reduced. With the mesa portion having the long axis parallel to the X'-axis like the mesa portion 112, the C mode, which is the main vibration, is easily to be confined, thereby ensuring reducing the end surface reflection, which is the unwanted response. Since the mesa portion 113 is formed into the shape of combining the elliptical shape whose long axis extends in the Z'-axis direction with the elliptical shape whose long axis extends in the X'-axis direction, the mesa portion 113 has the features of both of the mesa portion 111 and the mesa portion 112.

Figure 6B:
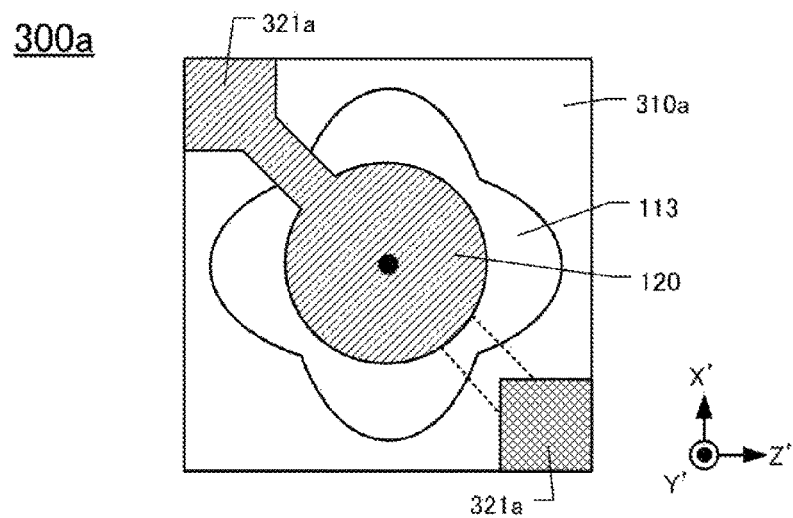
FIG. 6B is a plan view of a crystal resonator 300a, and FIG. 6C is a plan view of a crystal resonator 300b.

FIG. 6B is a plan view of the crystal resonator 300a. The crystal resonator 300a includes a crystal element 310a where the mesa portion 113 is formed, the excitation electrodes 120, and extraction electrodes 321a. The excitation electrodes 120 are formed on both principal surfaces of the crystal element 310a. The respective extraction electrodes 321a are extracted from the excitation electrodes 120. FIG. 6B shows an example where the length ZA and the length XB have the identical length, the crystal element 310a has square principal surfaces, and respective sides of the crystal element 310a are formed to be parallel to the Z'-axis or the X'-axis. The respective extraction electrodes 321a are extracted from the excitation electrodes 120 to a corner on the +X'-axis side and the −Z'-axis side of the crystal element 310a and a corner on the −X'-axis side and the +Z'-axis side on the diagonal line of the crystal element 310a.

The respective sides of the crystal element 310a of the crystal resonator 300a are formed extending in the X'-axis and the Z'-axis along the long axes of the mesa portion 111 and the mesa portion 112. This allows forming the wide area of the mesa portion 113 and therefore is preferable.

Figure 6C:
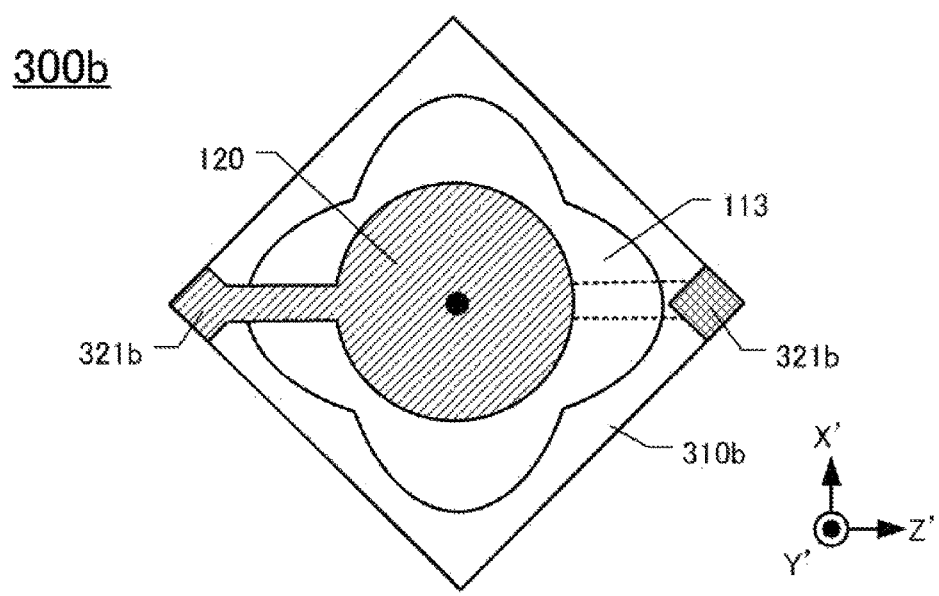

FIG. 6C is a plan view of the crystal resonator 300b. The crystal resonator 300b includes a crystal element 310b where the mesa portion 113 is formed, the excitation electrodes 120, and extraction electrodes 321b. The excitation electrodes 120 are formed on both principal surfaces of the crystal element 310b. The respective extraction electrodes 321b are extracted from the excitation electrodes 120. In FIG. 6C, the length ZA and the length XB have the identical length, the crystal element 310b has the square principal surfaces, and diagonal lines of the crystal element 310b are formed to be parallel to the Z'-axis and the X'-axis. The respective extraction electrodes 321b are each extracted from the excitation electrodes 120 to a corner on the +Z-axis side and a corner on the −Z'-axis side of the crystal element 310b.

The crystal resonator 300b has the diagonal line of the crystal element 310b formed parallel to the Z-axis or the X'-axis. This allows forming the wide area of the mesa portion 113 with respect to the area of the principal surface of the crystal element and therefore is preferable. In both cases of FIG. 6B and FIG. 6C, the crystal element is held at the corner portions on the diagonal line of the crystal element, ensuring stably holding the crystal element. However, the holding positions are not limited to these. FIG. 6C shows the example where the diagonal line of the crystal element is parallel to the Z'-axis and therefore the corner portions of the crystal element are positioned on the Z'-axis and the X'-axis. Note that, considering the influence given to the support or a similar influence, the diagonal line of the crystal element meets a preferable positional relationship where the diagonal line is not parallel to the Z'-axis and is positioned in a range of ±10 degrees with respect to the Z'-axis, that is, the corner portions of the crystal element are positioned on a line displaced from the Z'-axis and the X'-axis by predetermined degrees in some cases.

[Configurations of Crystal Resonator 400a and Crystal Resonator 400b]

Figure 7A:
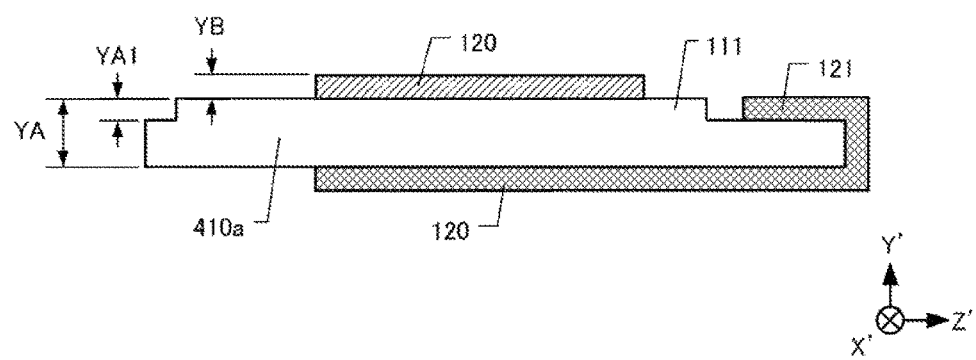
FIG. 7A is a cross-sectional view of a crystal resonator 400a, and FIG. 7B is a cross-sectional view of a crystal resonator 400b.

FIG. 7A is a cross-sectional view of the crystal resonator 400a. The crystal resonator 400a includes a crystal element 410a, the excitation electrodes 120, and the extraction electrode 121. The entire thickness of the crystal element 410a is formed to be YA, the mesa portion 111 is formed only on a surface on the +Y'-axis side, and a surface on the −Y'-axis side is formed into a planar shape. The crystal resonator 400a is a crystal resonator where the mesa portion 111 is not formed on the principal surface on the −Y'-axis side of the crystal resonator 100, which is illustrated in FIG. 2B. FIG. 7A illustrates a cross section of a part of the crystal resonator 400a corresponding to the cross section taken along the line IIB-IIB in FIG. 2A. With the crystal resonator, as illustrated in FIG. 7A, the mesa portion may be formed only on one principal surface.

Figure 7B:
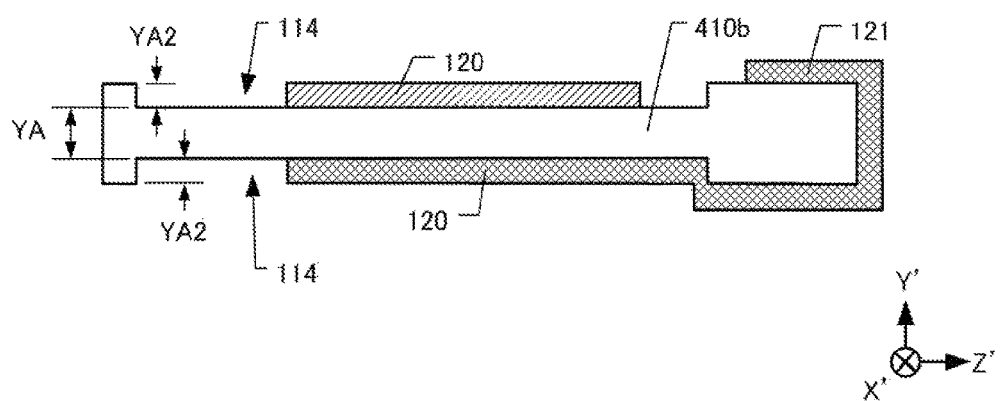

FIG. 7B is a cross-sectional view of the crystal resonator 400b. The crystal resonator 400b includes a crystal element 410b, the excitation electrodes 120, and the extraction electrode 121. Inverted mesa portions 114 are formed on principal surfaces on the +Y'-axis side and the −Y'-axis side of the crystal element 410b. While the inverted mesa portion 114, which has a planar elliptical shape, has the long axis extending in the Z'-axis direction similar to the mesa portion 111 (see FIG. 2A) of the crystal element 110, the inverted mesa portion 114 is formed to be depressed from the surface of the crystal element conversely from the mesa portion 111. A thickness of the crystal element 410b at the inverted mesa portions 114 is formed to be YA, and the respective inverted mesa portions 114 are formed to be depressed from the surfaces by a thickness YA2.

By reducing the size of the crystal element due to the downsizing of the crystal resonator, the influence given from the support of the crystal element to the vibrations increases. In contrast to this, with the crystal resonator 400b, the extraction electrode 121 to which the crystal resonator 400b is held is formed to have a height different from that of the surface where the excitation electrode 120, which generates the vibrations of the crystal element 410b, is formed. This prevents the extraction electrode 121 from preventing the vibrations of the crystal resonator. The elliptical inverted mesa portion 114 reduces the unnecessary vibrations similar to the mesa portion 111, thereby ensuring the reduction in CI value.

[Third Embodiment]

The formation of an inclined portion whose surface is inclined at a peripheral area of an excitation electrode and a peripheral area of a mesa portion can also reduce the flexure vibration. The following describes a crystal resonator with the inclined portion.

[Configuration of Crystal Resonator 500]

Figure 8A:
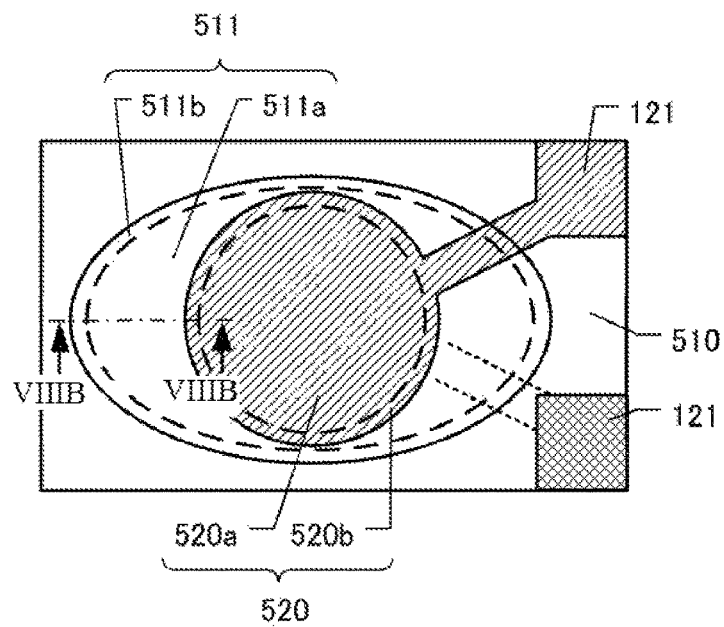
FIG. 8A is a plan view of a crystal resonator 500.

FIG. 8A is a plan view of the crystal resonator 500. The crystal resonator 500 includes a crystal element 510, which includes a mesa portion 511, excitation electrodes 520, and the extraction electrodes 121. The excitation electrode 520 is formed to have a circular shape identical to the excitation electrode 120 illustrated in FIG. 2A. The excitation electrode 520 includes a center portion 520a with constant thickness and an inclined portion 520b. The inclined portion 520b is formed at a peripheral area of the center portion 520a and has a thickness decreasing from the inner peripheral side to the outer peripheral side. FIG. 8A indicates the inside of the dotted line on the excitation electrode 520 as the center portion 520a while the outside of the dotted line as the inclined portion 520b. The mesa portion 511 is formed into the elliptical shape identical to the mesa portion 111 illustrated in FIG. 2A. The mesa portion 511 includes a center portion 511a with constant thickness and an inclined portion 511b. The inclined portion 511b is formed at a peripheral area of the center portion 511a and has a thickness decreasing from the inner peripheral side to the outer peripheral side. FIG. 8A indicates the inside of the dotted line on the mesa portion 511 as the center portion 511a and the outside of the dotted line as the inclined portion 511b.

Figure 8B:
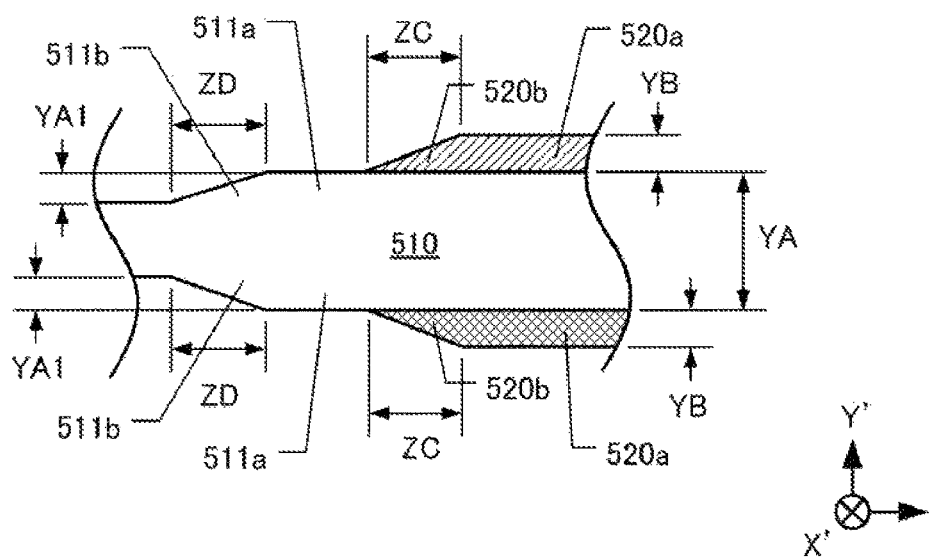
FIG. 8B is a cross-sectional view taken along a line VIIIB-VIIIB in FIG. 8A.

FIG. 8B is a cross-sectional view taken along a line VIIIB-VIIB in FIG. 8A. The thickness of the center portion 520a on the excitation electrode 520 is formed to be YB. The thickness of the inclined portion 520b is thinned with a length from the inner peripheral side to the outer peripheral side (inclination length) in a range of a length ZC. With the length ZC of the inclined portion 520b larger than ½ of the wavelength of unnecessary vibrations, the unnecessary vibrations can be reduced and the CI value can reduced in the excitation electrode 520. In the mesa portion 511, the thickness of the center portion 511a from the peripheral portion of the mesa portion 511 of the crystal element 510 is formed to be YA1. The thickness of the inclined portion 511b is thinned with a length from the inner peripheral side to the outer peripheral side (inclination length) in a range of the length ZD. With the length ZD of the inclined portion 511b larger than ½ of the wavelength of unnecessary vibrations, the unnecessary vibrations can be reduced and the CI value can reduced in the mesa portion 511.

Figure 8C:
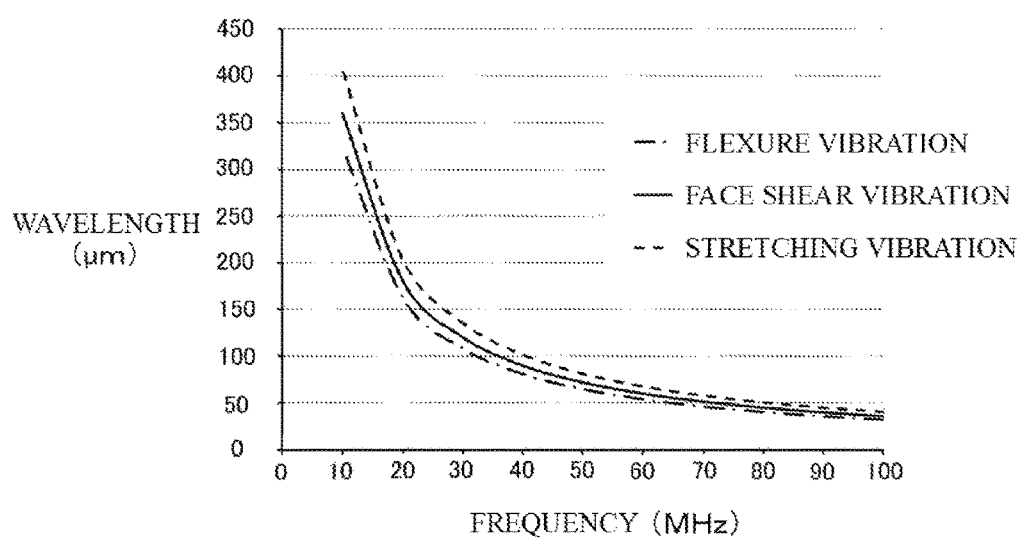
FIG. 8C is a graph showing a relationship between a wavelength in an unnecessary vibration and a frequency.

FIG. 8C is a graph showing the relationship between the wavelength in the unnecessary vibration and the frequency. FIG. 8C shows the frequency (MHz) of the crystal resonator on the horizontal axis and shows the wavelength (μm) of the unnecessary vibration on the vertical axis. The unnecessary vibration occurred in association with the main vibration includes various vibrations such as the flexure vibration, a face shear vibration, and a stretching vibration. FIG. 8C shows the flexure vibration by dashed-dotted line, shows the face shear vibration by the solid line, and shows the stretching vibration by the dotted line.

Since the flexure vibration affects the CI value of the doubly-rotated crystal resonator most among the unnecessary vibrations, reducing the flexure vibration becomes important to reduce the CI value. For example, the flexure vibration has the wavelength at 162.0 μm with the oscillation frequency of the crystal resonator of 20 MHz. Therefore, configuring the length ZC and the length ZD to be 81.0 μm or more, which is the half of the wavelength of the flexure vibration, can substantially reduce the flexure vibrations. As illustrated in FIG. 8C, since the face shear vibration and the stretching vibration have the wavelength longer than the flexure vibration, it is considered that providing the length ZC and the length ZD to a length so as to reduce the flexure vibration also reduces the face shear vibration and the stretching vibration.

[Inclination Length]

The following describes results of measuring and obtaining the relationship between the CI value and the temperature with the inclination length of the excitation electrode changed in the case where the excitation electrode with a thickness of 1400·Å and a diameter of 0.6 A mm was formed on a crystal element where an A-mm square mesa portion was not formed and was oscillated at 30 MHz.

Figure 9A:
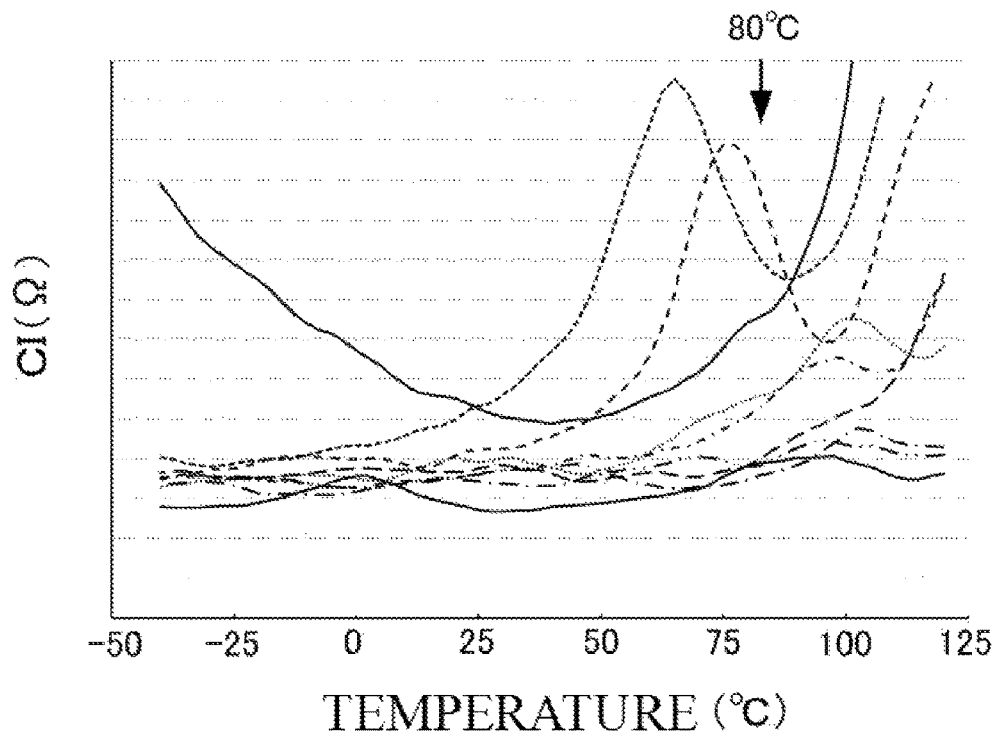
FIG. 9A is a graph showing the change in CI value according to the temperature with an inclination length of 0 µm.

FIG. 9A is a graph showing the change in CI value according to the temperature with the inclination length of 0 μm. The horizontal axis indicates the temperature of the crystal resonator, and the vertical axis indicates the CI value. FIG. 9A shows the change in CI value of the nine crystal resonators according to the temperature. Excitation electrodes on the respective crystal resonators in FIG. 9A are formed by the evaporation method, and the inclination length is formed to be 0 μm. That is, the respective crystal resonators illustrated in FIG. 9A do not include the inclined portions.

It is found from FIG. 9A that a tendency of the change in CI value according to the temperature substantially differs depending on the crystal resonator; therefore, the CI value is unstable. For example, at 80° C., the temperature at which the doubly-rotated crystal resonator is possibly used, the lowest CI value is approximately (R+50)Ω and the highest CI value is approximately (R+850)Ω. That is, the crystal resonators in FIG. 9A cause the variation of approximately 800Ω at 80° C.

Figure 9B:
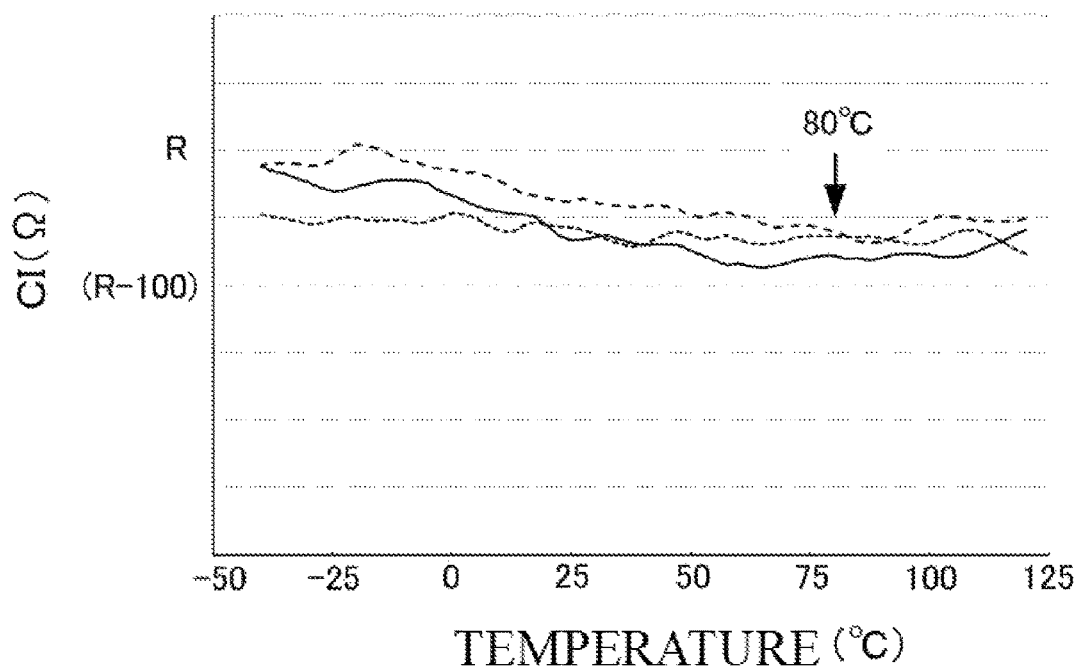
FIG. 9B is a graph showing the change in CI value according to the temperature with the inclination length of 50 µm.

FIG. 9B is a graph showing the change in CI value according to the temperature with the inclination length of 50 μm. FIG. 9B shows the change in CI value of the three crystal resonators according to the temperature. The excitation electrodes of the respective crystal resonators are formed by the evaporation method, and the inclination length is 50 μm. The CI values in FIG. 9B fall within a range of approximately from (R−100)Ω to R Ω. Especially, at 80° C., the temperature at which the doubly-rotated crystal resonator is possibly used, the lowest CI value is (R−77.94)Ω and the highest CI value is (R−58.89)Ω. That is, the crystal resonators in FIG. 9B cause the variation of 18.05Ω at 80° C. These results show that, compared with the crystal resonators shown in FIG. 9A, the formation of the inclined portion on the excitation electrode substantially reduces and stabilizes the CI value.

Figure 9C:
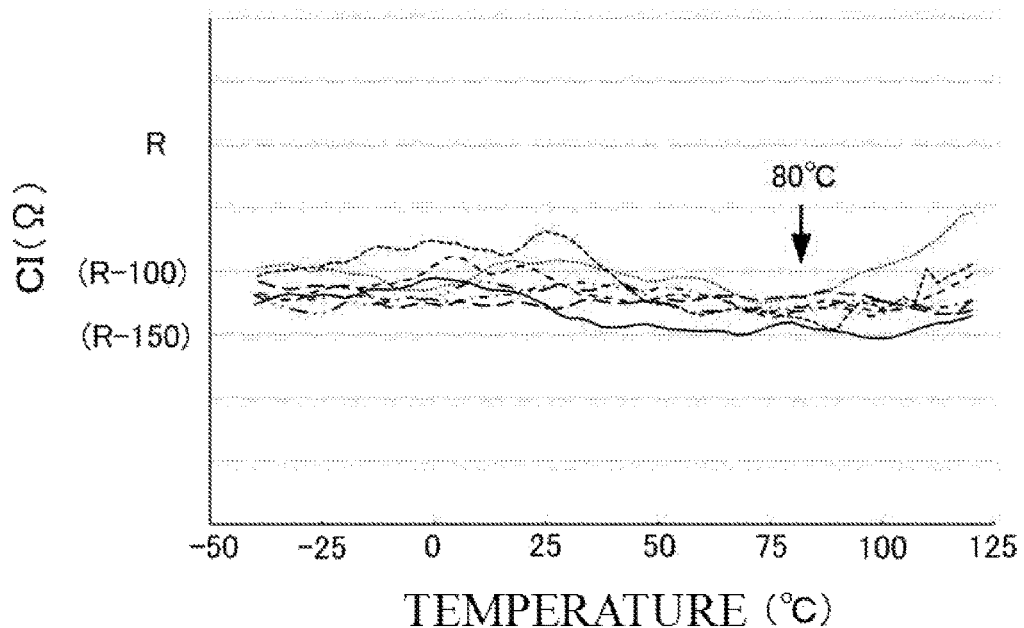
FIG. 9C is a graph showing the change in CI value according to the temperature with the inclination length of 55 µm.

FIG. 9C is a graph showing the change in CI value according to the temperature with the inclination length of 55 μm. FIG. 9C shows the change in CI value of the seven crystal resonators according to the temperature. The inclination length of the excitation electrodes formed by sputtering of the respective crystal resonators shown in FIG. 9C is 55 μm. That is, the formation method and the inclination length of the excitation electrodes differ from those of the crystal resonators in FIG. 9B. The CI values in FIG. 9C fall within a range of approximately from (R−150)Ω to (R−100)Ω. Especially, at 80° C., the temperature at which the doubly-rotated crystal resonator is possibly used, the lowest CI value is (R−140.11)Ω and the highest CI value is (R−120.23)Ω. That is, the crystal resonators in FIG. 9C cause the variation of 19.88Ω at 80° C.

The crystal resonators in FIG. 9C show that the formation of the inclined portion substantially reduces and stabilizes the CI value compared with the crystal resonators in FIG. 9A, similar to the crystal resonators in FIG. 9B. The crystal resonators in FIG. 9C entirely reduce the CI value by around 50Ω compared with the crystal resonators in FIG. 9B. It is thought that this result is caused by the inclination length of the crystal resonators in FIG. 9C being longer than that of the crystal resonators in FIG. 9B. Furthermore, the reason that only the 5-μm difference of the inclination length reduces the CI value to almost 50Ω is considered as follows. Since the inclination lengths in FIG. 9B and FIG. 9C are shorter than 54 μm, which is ½ of the wavelength of the flexure vibration, at 30 MHz, the flexure vibration is not sufficiently reduced. Accordingly, the reduced flexure vibration substantially differs depending on the slight difference of the inclination length.

Figure 9D:
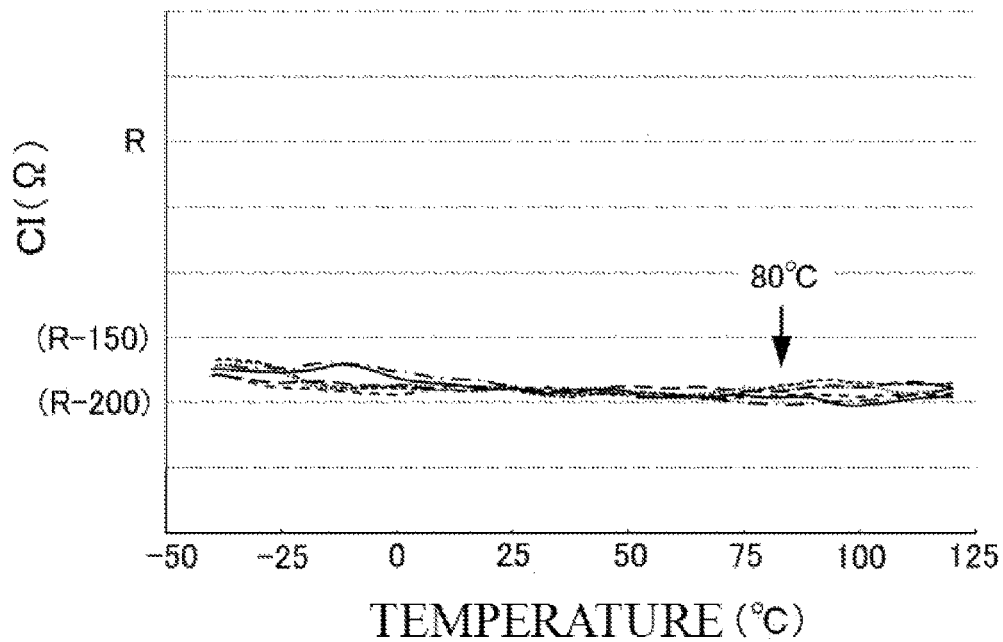
FIG. 9D is a graph showing the change in CI value according to the temperature with the inclination length of 400 µm.

FIG. 9D is a graph showing the change in CI value according to the temperature with the inclination length of 400 μm. FIG. 9D shows the change in CI value of the six crystal resonators according to the temperature. In the respective crystal resonators shown in FIG. 9D, the excitation electrodes are formed by sputtering, and the inclination length is 400 μm. The CI values in FIG. 9D fall within a range of approximately from (R−200)Ω to (R−150)Ω. Especially, at 80° C., the temperature at which the doubly-rotated crystal resonator is possibly used, the lowest CI value is (R−201.3)Ω and the highest CI value is (R−189.4) That is, the crystal resonators in FIG. 9D cause the variation of 11.9Ω at 80° C.

Compared with the crystal resonators in FIG. 9A to FIG. 9C, the crystal resonators in FIG. 9D have the lower CI values and the smaller variations of CI value. It is thought that these results are caused by the formation of the long inclination length. It is thought that, since the crystal resonators in FIG. 9D have the inclination length longer than 54 μm, which is ½ of the wavelength of the flexure vibration, at 30 MHz, the flexure vibration is sufficiently reduced. While the effects of the inclined portions in the excitation electrodes are described in FIG. 9A to FIG. 9D, the case where the inclined portion is formed on the mesa portion can also reduce the flexure vibration, reduce the CI value low, and reduce the variation of CI value small, similar to the case of the excitation electrode.

The excitation electrodes of the crystal resonators as shown in FIG. 9D can be formed by, for example, a method of forming a metallic mask formed from a metal plate by a photolithography technology and a wet etching technique. Specifically, the mask can be formed by, for example, the following methods. The mask is an overhang-shaped mask obtained using a property of promoting side etching together with etching in a thickness direction of the metal plate. Alternatively, a large number of thin masks whose opening dimensions become smaller little by little are laminated, and a spot welding is performed on these masks, thus forming one mask. The inclination length that can be manufactured by the usual formation method of the excitation electrode is around 50 μm at maximum and therefore the inclination length cannot be formed to be 400 μm. However, the use of the overhang-shaped mask or the mask formed by laminating the large number of thin masks allows the formation of the crystal resonators in FIG. 9D.

[Fourth Embodiment]

The excitation electrode may be formed to have various shapes. The following describes modifications of the excitation electrode.

[Configuration of Crystal Resonator 600]

Figure 10A:
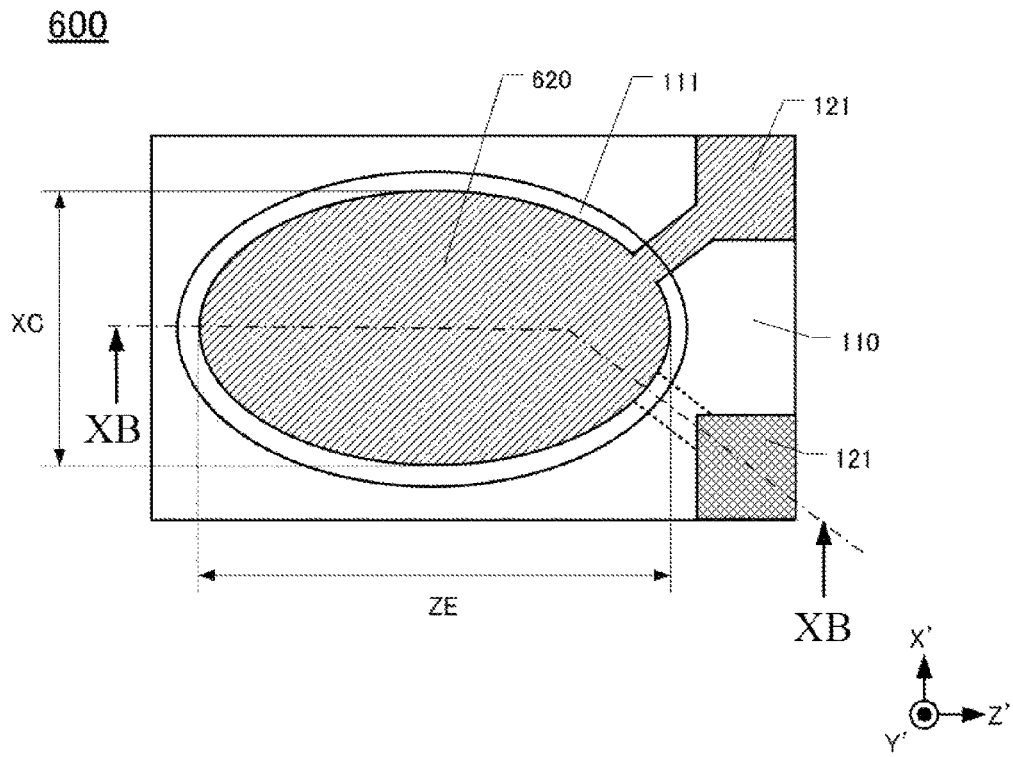
FIG. 10A is a plan view of a crystal resonator 600.

FIG. 10A is a plan view of the crystal resonator 600. The crystal resonator 600 includes the crystal element 110, excitation electrodes 620, and the extraction electrodes 121. The crystal resonator 600 differs from the crystal resonator 100 illustrated in FIG. 2A only in the shape of the excitation electrode. The excitation electrode 620 is formed to have the elliptical shape whose long axis extends in the Z'-axis direction and short axis extends in the X'-axis direction on the mesa portion 111. FIG. 10A denotes a length of the long axis of the excitation electrode 620 as ZE and a length of the short axis as XC.

While the circular excitation electrode 120 as illustrated in FIG. 2A can prevent the variation of and the increase in CI value, the elliptical excitation electrode further widens the area of the excitation electrode and therefore can ensure good electric constant. The excitation electrode with the long axis extending in the Z'-axis direction can reduce the flexure vibrations, which are the unwanted responses, transmitted in the Z'-axis direction. This can reduce the increase in CI value. Furthermore, the direction that the long axis of the excitation electrode extends is preferably the direction in the range of ±5 degrees with respect to the direction that the Z'-axis extends, similar to mesa portion 111 illustrated in FIG. 4A.

In the case where the length ZE of the long axis is in a range of 1.05 times to 2.0 times of the length XC of the short axis, the variation of and the increase in CI value tend to be reduced and therefore such length is preferable. In the case where the length ZE of the long axis is smaller than 1.05 times of the length XC of the short axis, since the excitation electrode has the shape close to the circular shape, the area of the excitation electrode cannot be widened. In the case where the length ZE of the long axis is larger than 2.0 times of the length XC of the short axis, the effects of ensuring preventing the variation of and the increase in CI value, which are seen in the circular excitation electrode, probably weaken.

Figure 10B:
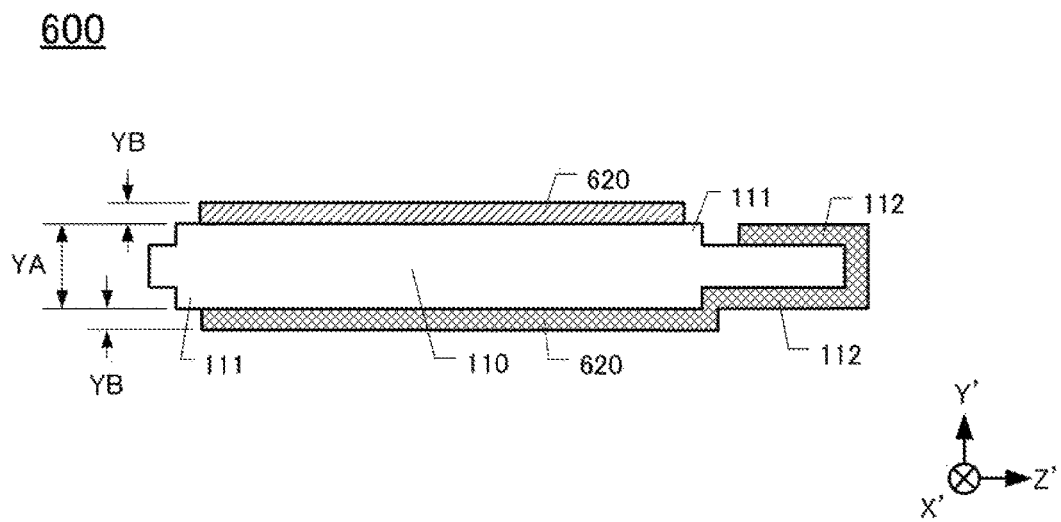
FIG. 10B is a cross-sectional view taken along a line XB-XB in FIG. 10A.

FIG. 10B is a cross-sectional view taken along a line XB-XB in FIG. 10A. A thickness of the excitation electrode 620 is formed to be YB similar to the excitation electrode 120 (see FIG. 2B) and is formed so as to be the thickness between 0.03% and 0.18% of the thickness YA of the crystal element 110. Although the excitation electrode 620 of the crystal resonator 600 is formed smaller than the area of the mesa portion 111, the area of the excitation electrode may be formed to be wider than the mesa portion 111 and cover the entire mesa portion 111.

[Configuration of Crystal Resonator 700]

Figure 11A:
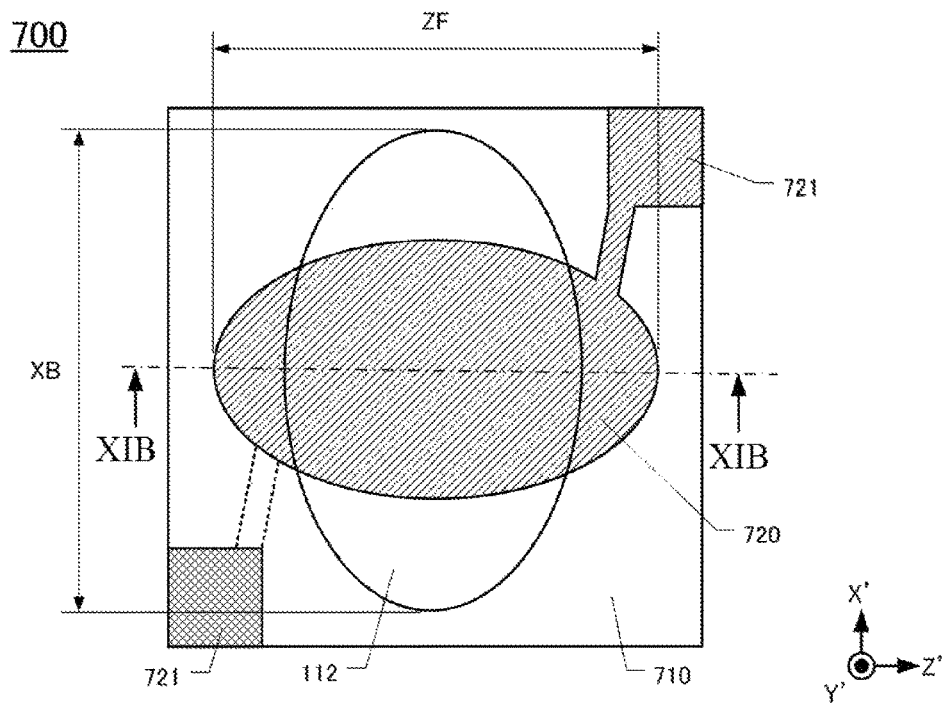
FIG. 11A is a plan view of a crystal resonator 700.

FIG. 11A is a plan view of the crystal resonator 700. The crystal resonator 700 includes a crystal element 710 that includes the mesa portion 112, excitation electrodes 720, and extraction electrodes 721. The mesa portion 112 is formed into the elliptical shape whose long axis extends in the X'-axis direction. The excitation electrode 720 is formed into the elliptical shape whose long axis extends in the Z'-axis direction. The crystal element 710 is formed so as to have square principal surfaces with sides parallel to the X'-axis and the Z'-axis. FIG. 11A denotes a length of the long axis of the mesa portion 112 as XB and a length of the long axis of the excitation electrode 720 as ZF. While FIG. 11A shows the case where the length XB is equal to the length ZF, the length XB may differ from the length ZF. The respective extraction electrodes 721 are extracted from the excitation electrodes 720 to a corner on the +X'-axis side and the +Z'-axis side and a corner on the −X'-axis side and the −Z'-axis side of the crystal element 710.

Figure 11B:
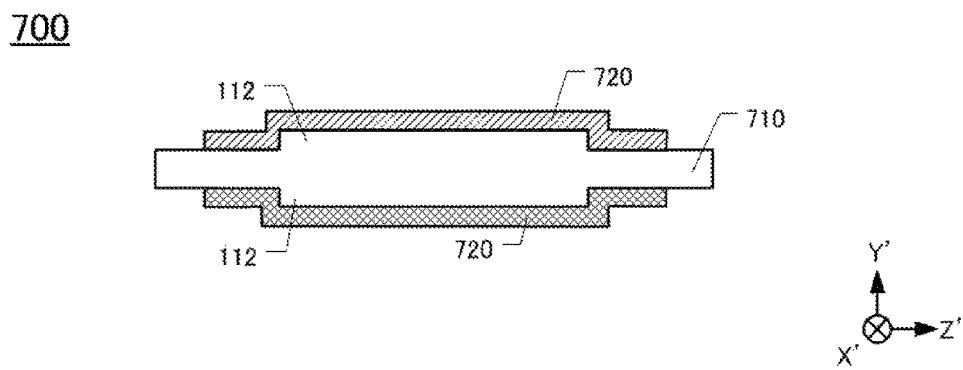
FIG. 11B is a cross-sectional view taken along a line XIB-XIB in FIG. 11A.

FIG. 11B is a cross-sectional view taken along a line XIB-XIB in FIG. 11A. In the crystal resonator 700, the mesa portions 112 and the excitation electrodes 720 are each formed on surfaces on the +Y'-axis side and the −Y'-axis side of the crystal element 710. Centers of the respective mesa portions 112 and excitation electrodes 720 are formed so as to overlap in the Y'-axis direction. With the crystal resonator 700, the mesa portions 112 with the long axis extending in the X'-axis direction confines the C mode, which is the main vibration, and reduces the end surface reflection, which is the unwanted response, and the excitation electrode 720 with the long axis extending in the Z'-axis direction reduces the flexure vibration, which is the unwanted response, transmitted in the Z'-axis direction, ensuring reducing the increase in CI value. With the crystal resonator 700, the long axis of the mesa portion extends in the X'-axis direction while the long axis of the excitation electrode extends in the Z'-axis direction. However, the long axis of the mesa portion may extend in the Z'-axis direction, and the long axis of the excitation electrode may extend in the X'-axis direction.

[Configuration of Crystal Resonator 700a]

Figure 11C:
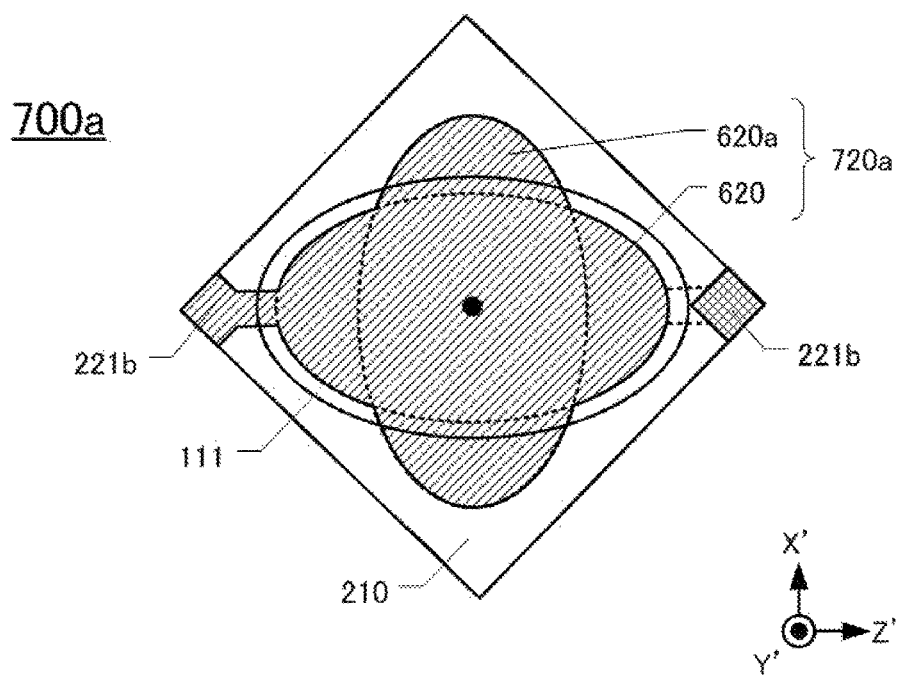

FIG. 11C is a plan view of the crystal resonator 700a. The crystal resonator 700a includes the crystal element 210 that includes the mesa portion 111, excitation electrodes 720a, and the extraction electrodes 221b. The mesa portion 111 is formed into the elliptical shape whose long axis extends in the Z'-axis direction. The excitation electrode 720a is formed into a shape of combining the elliptical excitation electrode 620 whose long axis extends in the Z'-axis direction with an elliptical excitation electrode 620a whose long axis extends in the X'-axis direction. The excitation electrode 620a with the long axis extending in the X'-axis direction easily confines the C mode, which is the main vibration of the crystal resonator, and the end surface reflection, which is the unwanted response, can be reduced, thereby ensuring reducing the increase in CI value. The direction that the long axis of the excitation electrode 620a extends is included within the range of −5 degrees to +15 degrees with respect to the X'-axis similar to the mesa portion 112 in FIG. 4B. The FIG. 11A and FIG. 11C show the examples where the long axis of the ellipse of the mesa portion goes along the X'-axis or the Z'-axis. However, with the long axis of the ellipse of the mesa portion extending in the X'-axis direction, the long axis of the ellipse may be in any given direction within the range of −5 degrees to +15 degrees with respect to the X'-axis. With the long axis of the ellipse of the mesa portion extending in the Z'-axis direction, the long axis of the ellipse may be in any given direction within the range of ±5 degrees with respect to the Z'-axis.

The excitation electrode 720a, which has the shape of combining the excitation electrode 620 with the excitation electrode 620a, has the features of the excitation electrode 620 and the excitation electrode 620a. Accordingly, the flexure vibration, which is the unwanted response, transmitted in the Z'-axis direction can be reduced, the C mode, which is the main vibration of the crystal resonator, can be easily confined, and the end surface reflection, which is the unwanted response, can be reduced. This ensures reducing the increase in CI value.

[Configuration of Crystal Resonator 800]

Figure 12A:
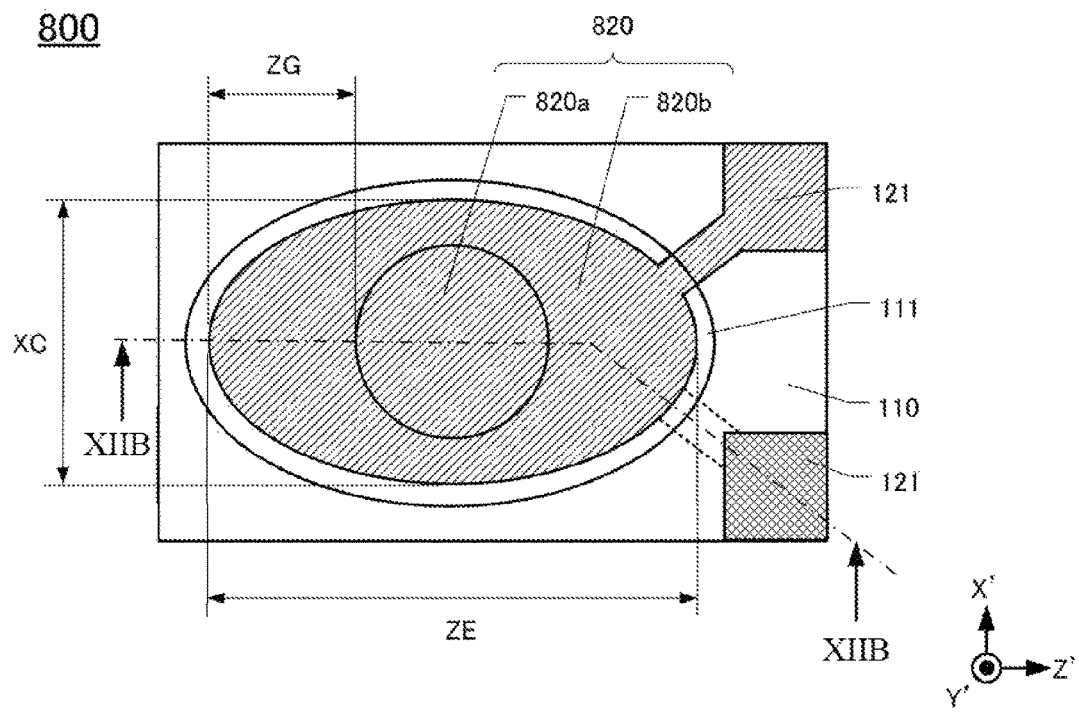
FIG. 12A is a plan view of a crystal resonator 800.

FIG. 12A is a plan view of the crystal resonator 800. The crystal resonator 800 includes the crystal element 110 that includes the mesa portion 111, excitation electrodes 820, and the extraction electrodes 121. The excitation electrode 820 includes a first region 820a with a circular outer shape and a second region 820b. The second region 820b is formed at a peripheral area of the first region 820a. The second region 820b has a thickness thinner than the first region 820a and has an elliptical outer shape. The excitation electrodes 820 are formed so as to match a center of the first region 820a with a center of the second region 820b. The extraction electrodes 121 are extracted from the respective excitation electrodes 820 to both ends of a side on the +Z'-axis side of the crystal element 110.

The second region 820b in the excitation electrode 820 is formed such that the long axis extends in the Z'-axis direction and the short axis extends in the X'-axis direction. FIG. 12A denotes a length of the long axis of the second region 820b as ZE, a length of the short axis of the second region 820b as XC, and a difference between a long radius of the second region 820b and a radius of the first region 820a as ZG.

Figure 12B:
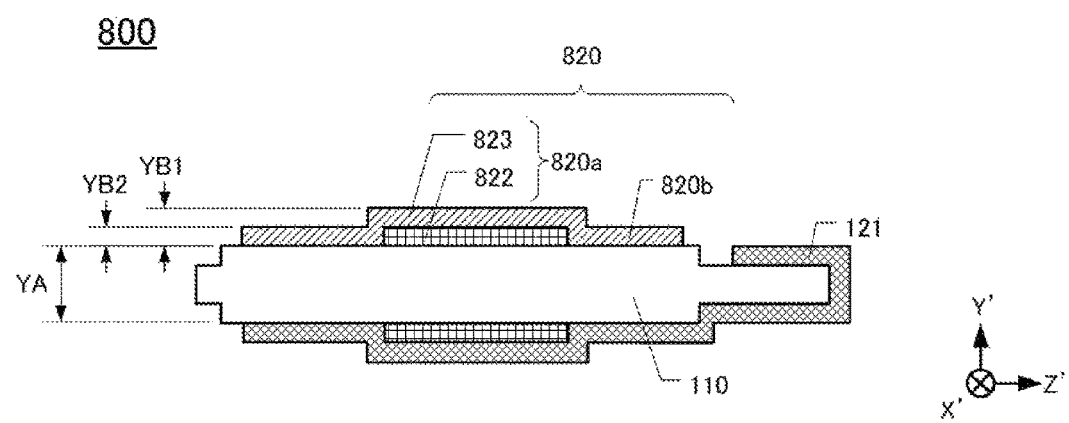
FIG. 12B is a cross-sectional view taken along a line XIIB-XIIB in FIG. 12A.

FIG. 12B is a cross-sectional view taken along a line XIIB-XIIB in FIG. 12A. FIG. 12B denotes a thickness of the crystal element 110 as YA, a thickness of the first region 820a in the excitation electrode 820 as YB1, and a thickness of the second region 820b in the excitation electrode 820 as YB2. The excitation electrodes 820 are double electrodes formed by stacking two electrode layers, a first layer 822 and a second layer 823 together. The first layer 822 and the second layer 823 are formed by forming, for example, each of the chrome (Cr) or the nickel (Ni) as a foundation layer and manufacturing a film of the gold (Au) on the foundation layer. The first layer 822 and the second layer 823 form the first region 820a in the excitation electrode 820. The second layer 823 forms the second region 820b. Therefore, the thickness of the first layer 822 is a value found by subtracting the thickness YB2 from the thickness YB1. The thickness of the second layer 823 is the thickness YB2.

The thickness YB1, which is the thickness of the excitation electrode 820, is preferably formed to be the thickness between 700·Å and 2000·Å and is especially preferably formed between 1200·Å and 1600·Å. There is a preferable relationship between the thickness YA and the thickness YB1. The thickness YB1 with the value between 0.02% and 0.13% of the thickness YA generates a small variation of CI value and therefore is preferable. Furthermore, since the increase in CI value and the variation of CI value can be reduced, it is preferable to form the first region 820a and the second region 820b so as to have a difference in thickness (YB1–YB2) in a range of ¼ times to one time with respect to the thickness YB2 of the second region 820b.

[Double Electrodes]

With the crystal resonator 800, the double electrodes are formed to reduce the CI value. The following describes effects brought by the double electrodes.

Figure 13A:
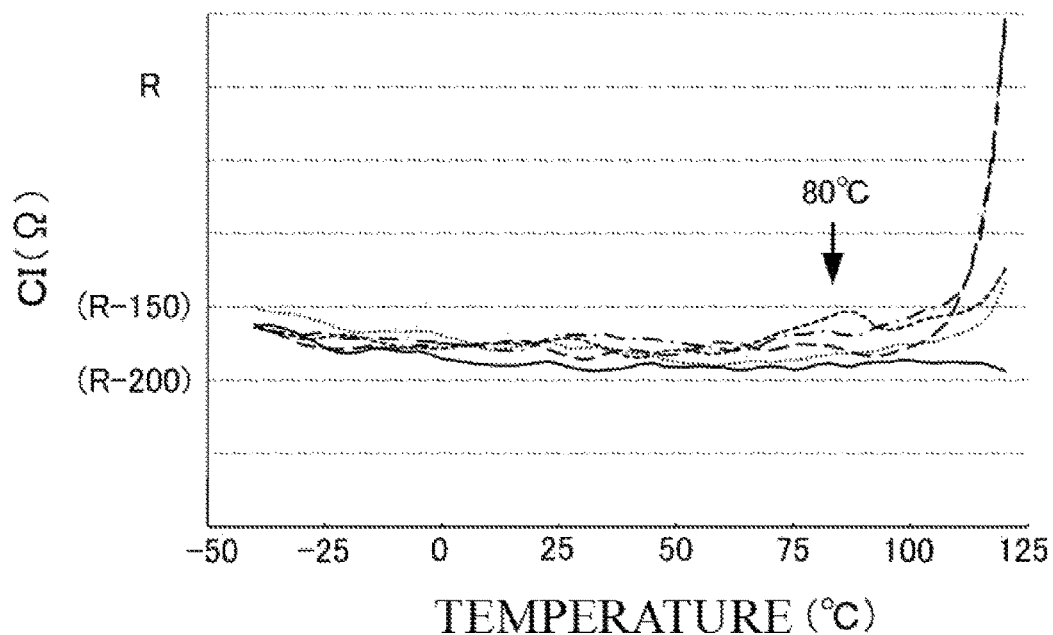
FIG. 13A is a graph showing the change in CI value according to the temperature in the case where crystal resonators with double electrodes whose long axes are 1.1 times of short axes are oscillated at 20 MHz.

FIG. 13A is a graph showing the change in CI value according to the temperature in the case where the crystal resonators with the double electrodes whose long axes are 1.1 times of the short axes are oscillated at 20 MHz. FIG. 13A shows the change in CI value of the five crystal resonators according to the temperature. The crystal resonators in FIG. 13A include the elliptical excitation electrodes formed as the double electrodes that include a first region with a diameter of 0.75 C mm, a second region with a length of a long axis of 1.1 C mm and a length of a short axis of C mm. The long axis of the excitation electrodes is parallel to the Z'-axis.

The CI values in FIG. 13A fall within approximately (R−200)Ω to (R−150)Ω. For example, at 80° C., the temperature at which the doubly-rotated crystal resonator is possibly used, the lowest CI value is (R−189.4)Ω and the highest CI value is (R−159.7)Ω. That is, FIG. 13A shows that the crystal resonators possibly cause the variation of CI value by 29.7)Ω at 80° C.

Figure 13B:
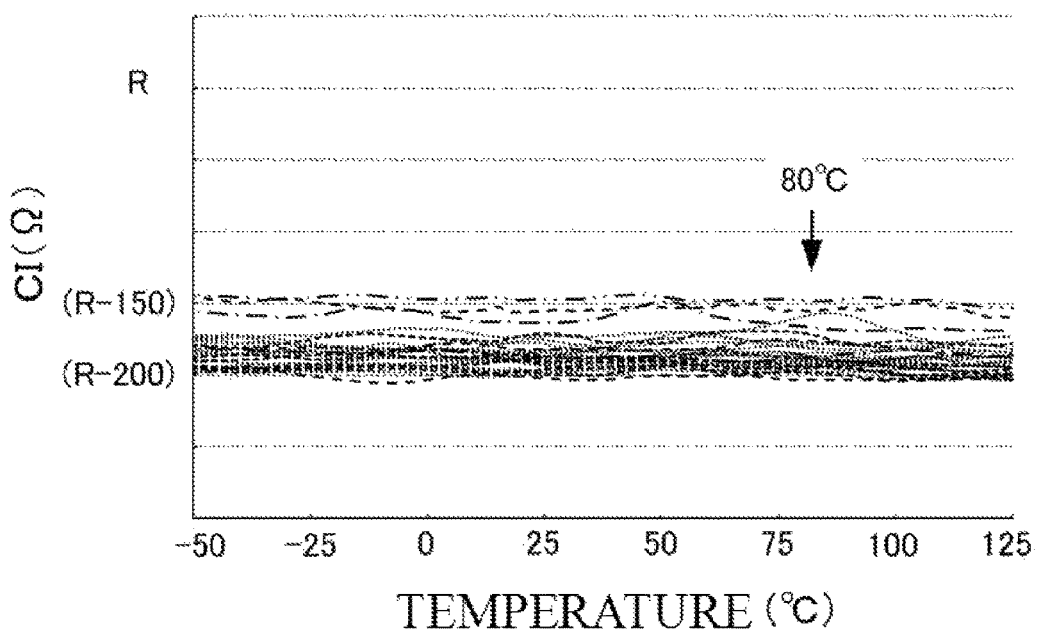
FIG. 13B is a graph showing the change in CI value according to the temperature in the case where crystal resonators with double electrodes whose long axes are 1.12 times of short axes are oscillated at 40 MHz.

FIG. 13B is a graph showing the change in CI value according to the temperature in the case where the crystal resonators with the double electrodes whose long axes are 1.12 times of the short axes are oscillated at 40 MHz. FIG. 13B shows the change in CI value of the 36 crystal resonators according to the temperature. The crystal resonators in FIG. 13B include the elliptical excitation electrodes formed as the double electrodes that include the first region with the diameter of D mm, the second region with the length of the long axis of 1.345×D mm, and the length of the short axis of 1.2×D mm. The long axis of the excitation electrodes is parallel to the Z'-axis.

The CI values in FIG. 13B fall within approximately (R−200)Ω to (R−150)Ω. For example, at 80° C., the temperature at which the doubly-rotated crystal resonator is possibly used, the lowest CI value is (R−202.92)Ω and the highest CI value is (R−147.84)Ω. That is, FIG. 13B shows that the crystal resonators possibly cause the variation of CI value by 54.98Ω at 80° C.

It is seen that the crystal resonator including the excitation electrodes formed as the double electrodes as illustrated in FIG. 13A and FIG. 13B has the lower CI value and the smaller variation of CI value compared with those of the excitation electrode of the single layer as shown in FIG. 3A.

[Configuration of Crystal Resonator 900]

Figure 14A:
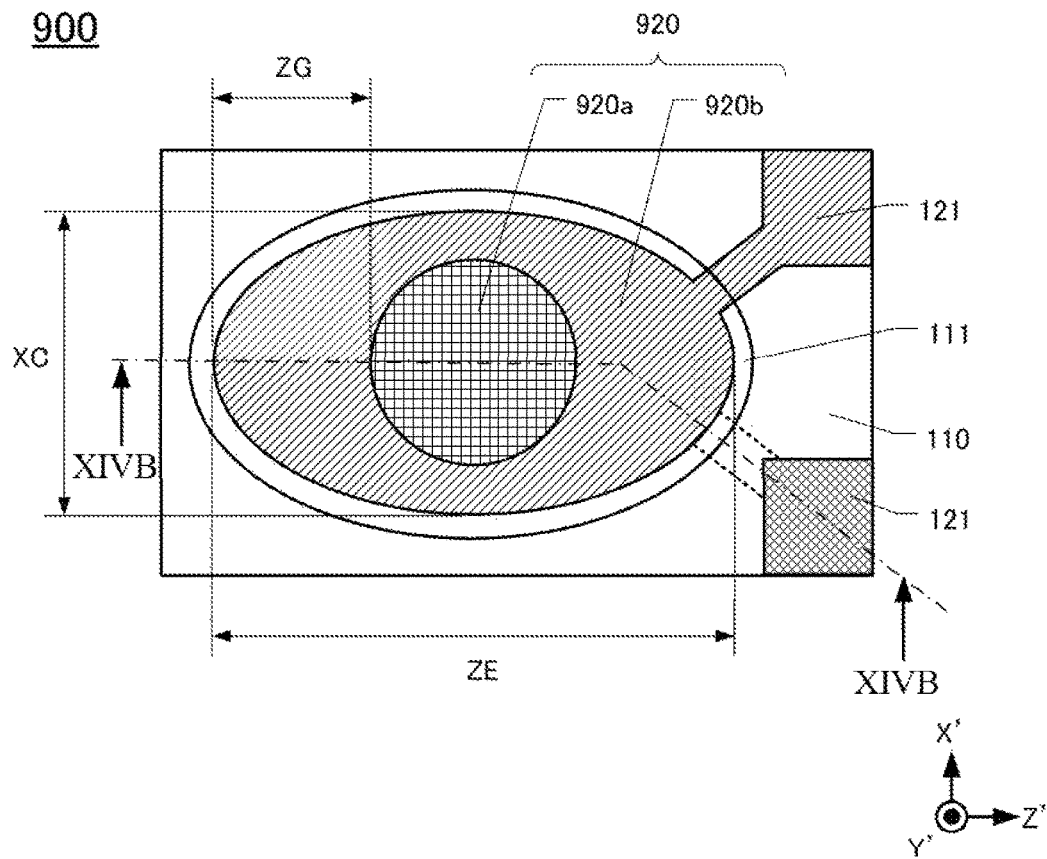
FIG. 14A is a plan view of a crystal resonator 900.

FIG. 14A is a plan view of the crystal resonator 900. The crystal resonator 900 includes the crystal element 110, excitation electrodes 920, and the extraction electrodes 121. The excitation electrode 920 includes a first region 920a with a circular outer shape and a second region 920b. The second region 920b is formed at a peripheral area of the first region 920a. The second region 920b has a thickness thinner than the first region 920a and has an elliptical outer shape.

The second region 920b is formed such that a long axis extends in the Z'-axis direction and a short axis extends in the X'-axis direction similar to the second region 820b (see FIG. FIG. 12A). FIG. 14A denotes a length of the long axis of the second region 920b as ZE, a length of the short axis of the second region 920b as XC, and a difference between a long radius of the second region 920b and a radius of the first region 920a as ZG. The length ZE of the long axis is formed to be in a range of 1.1 times to 2.0 times of the length XC of the short axis.

Figure 14B:
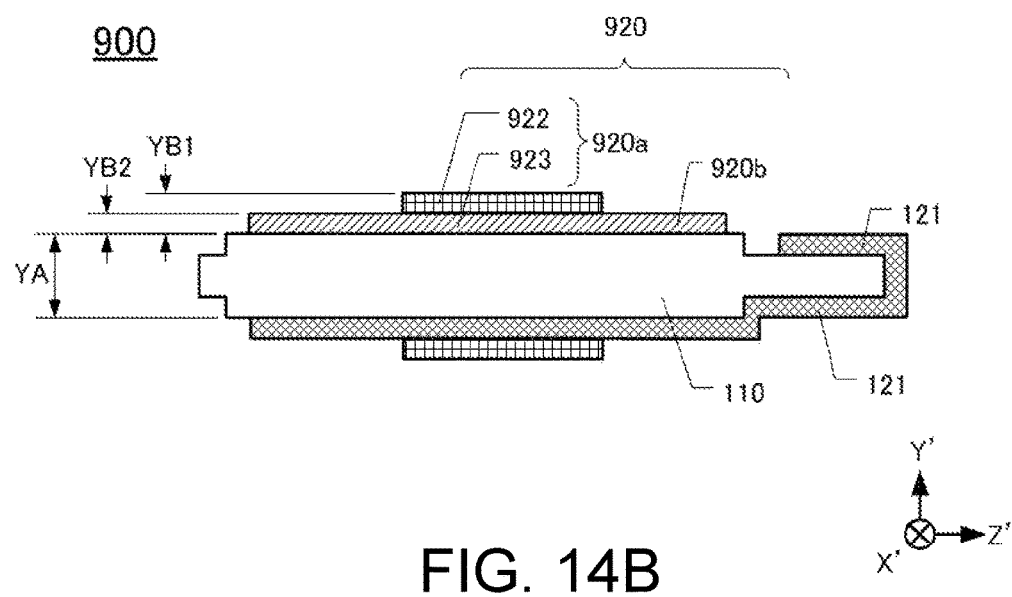
FIG. 14B is a cross-sectional view taken along a line XIVB-XIVB in FIG. 14A.

FIG. 14B is a cross-sectional view taken along a line XIVB-XIVB in FIG. 14A. Similar to the crystal resonator 800, in the crystal resonator 900, the thickness of the crystal element 110 is denoted as YA, a thickness of the first region 920a in the excitation electrode 920 as YB1, and a thickness of the second region 920b in the excitation electrode 920 as YB2. While the excitation electrodes 920 are the double electrodes formed by stacking two electrode layers, a first layer 922 and a second layer 923, the first layer 922 is formed on the second layer 923 in the first region 920a unlike the excitation electrode 820 (see FIG. 12B).

In the crystal resonator with the excitation electrodes formed as the double electrodes, even if the order of formations of the first layer and the second layer in the first region are changed and formed like the crystal resonator 900, unless the outer shape of the excitation electrode is changed, the crystal resonator can reduce the CI value and reduce the variation of CI value similar to the crystal resonator 800.

The crystal resonator of a second aspect according to the first aspect is configured as follows. The elliptical shape has a long axis extending in a direction in a range of −5 degrees to +15 degrees with respect to a direction that the X'-axis extends.

The crystal resonator of a third aspect according to the first aspect is configured as follows. The elliptical shape has a long axis extending in a direction in a range of ±5 degrees with respect to a direction that the Z'-axis extends.

The crystal resonators of fourth aspects according to the first aspect to the third aspects are configured as follows. The crystal element is formed into a square or a rectangle where one diagonal line is in a range of ±10° with respect to the Z'-axis. Alternatively, the crystal element is formed into a square or a rectangle where one side is in a range of ±10° with respect to the Z'-axis (Note that the square and the rectangle include an approximately square and an approximately rectangle where a corner portion of the crystal element has a rounded shape or a similar shape). The reason of describing the range as ±10° here is that the excitation electrodes according to this disclosure are disposed at the specific positions within this range and further an influence given to the support of the crystal element can be reduced and the crystal element easy to be processed is selectable.

The crystal resonators of fifth aspects according to the first aspect to the fourth aspects are configured as follows. A ratio of the long axis to a short axis of the elliptical shape is in a range of 1.05:1 to 2.0:1.

According to a six aspect of this disclosure, there is provided a crystal resonator that includes a crystal element and excitation electrodes. The crystal element has a pair of principal surfaces parallel to an X'-axis and a Z'-axis. The X'-axis is an axis of rotating an X-axis as a crystallographic axis of a crystal in a range of 15 degrees to 25 degrees around a Z-axis as a crystallographic axis of the crystal. The Z'-axis is an axis of rotating the Z-axis in a range of 33 degrees to 35 degrees around the X'-axis. The excitation electrodes are formed on the respective principal surfaces of the crystal element. Mesa portions with a predetermined shape or inverted mesa portions with a predetermined shape are formed on the respective principal surfaces. The mesa portions project from outer peripheries of the principal surfaces. The inverted mesa portions are depressed from the outer peripheries of the principal surfaces. The predetermined shape is a shape of combining a first elliptical shape and a second elliptical shape. The first elliptical shape has a long axis extending in a direction in a range of −5 degrees to +15 degrees with respect to a direction that the X'-axis extends. The second elliptical shape has a long axis extending in a direction in a range of ±5 degrees with respect to a direction that the Z'-axis extends.

The crystal resonator of a seventh aspect according to the sixth aspect is configured as follows. The first elliptical shape has a ratio of the long axis to a short axis in a range of 1.05:1 to 2.0:1. The second elliptical shape has a ratio of the long axis to a short axis in a range of 1.05:1 to 2.0:1.

The crystal resonators of eighth aspects according to the first aspect to the seventh aspect are configured as follows. The excitation electrodes are each formed into an elliptical shape. The excitation electrodes have a long axis extending in a direction in a range of −5 degrees to +15 degrees with respect to a direction that the X'-axis extends. The excitation electrodes have a long axis extending in a direction in a range of ±5 degrees with respect to a direction that the Z'-axis extends.

The crystal resonators of ninth aspects according to the first aspect to the seventh aspect are configured as follows. The excitation electrodes are each formed into a shape of combining a first elliptical shape and a second elliptical shape. The first elliptical shape has a long axis extending in a direction in a range of −5 degrees to +15 degrees with respect to a direction that the X'-axis extends. The second elliptical shape has a long axis extending in a direction in a range of ±5 degrees with respect to a direction that the Z'-axis extends.

The crystal resonators of tenth aspects according to the first aspect to the eighth aspect are configured as follows. The crystal element vibrates at a predetermined frequency. The excitation electrodes include a center portion and an inclined portion. The center portion has a constant thickness. The inclined portion is formed at a peripheral area of the center portion. The inclined portion has a thickness decreasing from an inner peripheral side to an outer peripheral side. A width between the inner peripheral side and the outer peripheral side of the inclined portion is longer than ½ wavelength of an unnecessary vibration in the crystal element.

The crystal resonator of an eleventh aspect according to the tenth aspect is configured as follows. The excitation electrode has a thickness 0.03% to 0.18% of a thickness of the crystal element.

The crystal resonators of twelfth aspects according to the first aspect to the seventh aspect are configured as follows. The excitation electrodes include a first region with a circular outer shape and a second region with an elliptical outer shape. The second region is formed at a peripheral area of the first region. The second region has a thickness thinner than the first region.

The crystal resonator of a thirteenth aspect according to the twelfth aspect is configured as follows. The outer shape of the second region has a long axis extending in a direction in a range of −5 degrees to +15 degrees with respect to a direction that the X'-axis extends. Alternatively, the long axis extends in a direction in a range of ±5 degrees with respect to a direction that the Z'-axis extends.

The crystal resonator of a fourteenth aspect according to the thirteenth aspect is configured as follows. A ratio of the long axis to a short axis of the elliptical shape is in a range of 1.05:1 to 2.0:1.

The crystal resonators of fifteenth aspects according to the thirteenth aspect and the fourteenth aspect are configured as follows. The crystal element vibrates at a predetermined frequency. A center of the elliptical shape matches a center of the circular shape. A difference between a long radius of the elliptical shape and a radius of the circular shape is natural number times of a wavelength of an unnecessary vibration occurred together with the vibration.

The crystal resonator of a sixteenth aspect according to the twelfth aspect is configured as follows. The outer shape of the second region is formed into a shape of combining a first elliptical shape and a second elliptical shape. The first elliptical shape has a long axis extending in a direction in a range of −5 degrees to +15 degrees with respect to a direction that the X'-axis extends. The second elliptical shape has a long axis extending in a direction in a range of +5 degrees with respect to a direction that the Z'-axis extends.

The crystal resonator of a seventeenth aspect according to the sixteenth aspect is configured as follows. The first elliptical shape of the excitation electrode has a ratio of the long axis to a short axis in a range of 1.05:1 to 2.0:1. The second elliptical shape of the excitation electrode has a ratio of the long axis to a short axis in a range of 1.05:1 to 2.0:1.

The crystal resonators of eighteenth aspects according to the sixteenth aspect and the seventeenth aspect are configured as follows. The crystal element vibrates at a predetermined frequency. A center of the first elliptical shape of the excitation electrode, a center of the second elliptical shape of the excitation electrode, and a center of the circular shape of the excitation electrode match. A difference between a long radius of the first elliptical shape and a radius of the circular shape of the excitation electrode, and a difference between a long radius of the second elliptical shape and the radius of the circular shape of the excitation electrode are respective natural number times of a wavelength of an unnecessary vibration occurred together with the vibration.

The crystal resonators of nineteenth aspects according to the twelfth aspect to the eighteenth aspect are configured as follows. The excitation electrodes have a thickness in a range of 0.02% to 0.13% of a thickness of the crystal element.

The crystal resonators of twentieth aspects according to the twelfth aspect to the nineteenth aspect are configured as follows. The first region and the second region are formed to have a difference in thickness in a range of ¼ times to one time with respect to a thickness of the second region.

With the crystal resonator according to the embodiments, a coupling of an unwanted response to a main vibration is reduced, thereby ensuring reducing a CI value low.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal resonator, comprising:
a crystal element that has a pair of principal surfaces parallel to an X'-axis and a Z'-axis, the X'-axis being an axis of rotating an X-axis as a crystallographic axis of a crystal in a range of 15 degrees to 25 degrees around a Z-axis as a crystallographic axis of the crystal, the Z'-axis being an axis of rotating the Z-axis in a range of 33 degrees to 35 degrees around the X'-axis; and
excitation electrodes, formed on the respective principal surfaces of the crystal element, wherein
mesa portions with an elliptical shape or inverted mesa portions with an elliptical shape are formed on the respective principal surfaces, the mesa portions projecting from outer peripheries of the principal surfaces, the inverted mesa portions being depressed from outer peripheries of the principal surfaces.

2. The crystal resonator according to claim 1, wherein the elliptical shape has a long axis extending in a direction in a range of −5 degrees to +15 degrees with respect to a direction that the X'-axis extends.

3. The crystal resonator according to claim 1, wherein the elliptical shape has a long axis extending in a direction in a range of ±5 degrees with respect to a direction that the Z'-axis extends.

4. The crystal resonator according to claim 1, wherein the crystal element is formed into a square or a rectangle where one diagonal line is in a range of ±10° with respect to the Z'-axis, alternatively,
the crystal element being formed into a square or a rectangle where one side is in a range of ±10° with respect to the Z'-axis.

5. The crystal resonator according to claim 1, wherein a ratio of a long axis to a short axis of the elliptical shape is in a range of 1.05:1 to 2.0:1.

6. The crystal resonator according to claim 1, wherein the excitation electrodes are each formed into an elliptical shape,
the excitation electrodes having a long axis extending in a direction in a range of −5 degrees to +15 degrees with respect to a direction that the X'-axis extends, alternatively,
the excitation electrodes having a long axis extending in a direction in a range of ±5 degrees with respect to a direction that the Z'-axis extends.

7. The crystal resonator according to claim 1, wherein the excitation electrodes are each formed into a shape of combining a first elliptical shape and a second elliptical shape,
the first elliptical shape having a long axis extending in a direction in a range of −5 degrees to +15 degrees with respect to a direction that the X'-axis extends,
the second elliptical shape having a long axis extending in a direction in a range of ±5 degrees with respect to a direction that the Z'-axis extends.

8. The crystal resonator according to claim 1, wherein the crystal element vibrates at a predetermined frequency,
the excitation electrodes include a center portion and an inclined portion, the center portion having a constant thickness, the inclined portion being formed at a peripheral area of the center portion, the inclined portion having a thickness decreasing from an inner peripheral side to an outer peripheral side, and
a width between the inner peripheral side and the outer peripheral side of the inclined portion is longer than ½ wavelength of an unnecessary vibration in the crystal element.

9. The crystal resonator according to claim 8, wherein the excitation electrode has a thickness 0.03% to 0.18% of a thickness of the crystal element.

10. The crystal resonator according to claim 1, wherein the excitation electrodes include a first region with an outer shape in a circular shape and a second region with an outer shape in an elliptical shape, the second region being formed at a peripheral area of the first region, the second region having a thickness thinner than the first region.

11. The crystal resonator according to claim 10, wherein the outer shape of the second region has a long axis extending in a direction in a range of −5 degrees to +15 degrees with respect to a direction that the X'-axis extends, alternatively,
the long axis extending in a direction in a range of ±5 degrees with respect to a direction that the Z'-axis extends.

12. The crystal resonator according to claim 11, wherein a ratio of the long axis to a short axis of the elliptical shape is in a range of 1.05:1 to 2.0:1.

13. The crystal resonator according to claim 11, wherein the crystal element having a vibration which vibrates at a predetermined frequency,
a center of the elliptical shape matches a center of the circular shape, and
a difference between a long radius of the elliptical shape and a radius of the circular shape is natural number times of a wavelength of an unnecessary vibration occurred together with the vibration.

14. The crystal resonator according to claim 10, wherein the outer shape of the second region is formed into a shape of combining a first elliptical shape and a second elliptical shape, the first elliptical shape having a long axis extending in a direction in a range of −5 degrees to +15 degrees with respect to a direction that the X'-axis extends, the second elliptical shape having a long axis extending in a direction in a range of ±5 degrees with respect to a direction that the Z'-axis extends.

15. The crystal resonator according to claim 14, wherein the first elliptical shape of the excitation electrode has a ratio of the long axis to a short axis in a range of 1.05:1 to 2.0:1,
the second elliptical shape of the excitation electrode having a ratio of the long axis to a short axis in a range of 1.05:1 to 2.0:1.

16. The crystal resonator according to claim 14, wherein the crystal element having a vibration which vibrates at a predetermined frequency,
a center of the first elliptical shape of the excitation electrode, a center of the second elliptical shape of the excitation electrode, and a center of the circular shape of the excitation electrode match, and
a difference between a long radius of the first elliptical shape and a radius of the circular shape of the excitation electrode, and a difference between a long radius of the second elliptical shape and the radius of the circular shape of the excitation electrode are respective natural number times of a wavelength of an unnecessary vibration occurred together with the vibration.

17. The crystal resonator according to claim 10, wherein the excitation electrodes have a thickness in a range of 0.02% to 0.13% of a thickness of the crystal element.

18. The crystal resonator according to claim 10, wherein the first region and the second region are formed to have a difference in thickness in a range of ¼ times to one time with respect to a thickness of the second region.

19. A crystal resonator, comprising:
a crystal element that has a pair of principal surfaces parallel to an X'-axis and a Z'-axis, the X'-axis being an axis of rotating an X-axis as a crystallographic axis of a crystal in a range of 15 degrees to 25 degrees around a Z-axis as a crystallographic axis of the crystal, the Z'-axis being an axis of rotating the Z-axis in a range of 33 degrees to 35 degrees around the X'-axis; and
excitation electrodes, formed on the respective principal surfaces of the crystal element, wherein
mesa portions with a predetermined shape or inverted mesa portions with a predetermined shape are formed on the respective principal surfaces, the mesa portions projecting from outer peripheries of the principal surfaces, the inverted mesa portions being depressed from outer peripheries of the principal surfaces; and
the predetermined shape is a shape of combining a first elliptical shape and a second elliptical shape, the first elliptical shape having a long axis extending in a direction in a range of −5 degrees to +15 degrees with respect to a direction that the X'-axis extends, the second elliptical shape having a long axis extending in a direction in a range of ±5 degrees with respect to a direction that the Z'-axis extends.

20. The crystal resonator according to claim 19, wherein the first elliptical shape has a ratio of the long axis to a short axis in a range of 1.05:1 to 2.0:1,
the second elliptical shape having a ratio of the long axis to a short axis in a range of 1.05:1 to 2.0:1.

21. The crystal resonator according to claim 19, wherein the excitation electrodes are each formed into an elliptical shape,
the excitation electrodes having a long axis extending in a direction in a range of −5 degrees to +15 degrees with respect to a direction that the X'-axis extends, alternatively,
the excitation electrodes having a long axis extending in a direction in a range of ±5 degrees with respect to a direction that the Z'-axis extends.

22. The crystal resonator according to claim 19, wherein the excitation electrodes are each formed into a shape of combining a first elliptical shape and a second elliptical shape,
the first elliptical shape having a long axis extending in a direction in a range of −5 degrees to +15 degrees with respect to a direction that the X'-axis extends,
the second elliptical shape having a long axis extending in a direction in a range of ±5 degrees with respect to a direction that the Z'-axis extends.

23. The crystal resonator according to claim 19, wherein the crystal element vibrates at a predetermined frequency,
the excitation electrodes include a center portion and an inclined portion, the center portion having a constant thickness, the inclined portion being formed at a peripheral area of the center portion, the inclined portion having a thickness decreasing from an inner peripheral side to an outer peripheral side, and
a width between the inner peripheral side and the outer peripheral side of the inclined portion is longer than ½ wavelength of an unnecessary vibration in the crystal element.

* * * * *